US010658951B2

(12) United States Patent
Kawai et al.

(10) Patent No.: US 10,658,951 B2
(45) Date of Patent: May 19, 2020

(54) ELECTRIC WORKING MACHINE AND METHOD FOR SMOOTHING AC POWER SUPPLIED THERETO

(71) Applicant: MAKITA CORPORATION, Anjo-shi, Aichi (JP)

(72) Inventors: Yuki Kawai, Anjo (JP); Itsuku Kato, Anjo (JP)

(73) Assignee: MAKITA CORPORATION, Anjo-shi (JP)

( * ) Notice: Subject to any disclaimer, the term of this patent is extended or adjusted under 35 U.S.C. 154(b) by 4 days.

(21) Appl. No.: 15/657,484

(22) Filed: Jul. 24, 2017

(65) Prior Publication Data

US 2018/0034388 A1 Feb. 1, 2018

(30) Foreign Application Priority Data

Jul. 29, 2016 (JP) .................................. 2016-149991

(51) Int. Cl.
*H02P 1/02* (2006.01)
*H02P 29/024* (2016.01)
(Continued)

(52) U.S. Cl.
CPC .............. *H02P 1/022* (2013.01); *H02H 9/002* (2013.01); *H02M 1/36* (2013.01); *H02M 7/062* (2013.01);
(Continued)

(58) Field of Classification Search
CPC ........ H02P 1/022; H02P 29/0241; H02P 6/20; H02H 9/002; H02M 1/36; H02M 7/062;
(Continued)

(56) References Cited

U.S. PATENT DOCUMENTS 4,573,113 A * 2/1986 Bauman .................. H02M 5/45
363/37
6,222,749 B1 4/2001 Peron
(Continued)

FOREIGN PATENT DOCUMENTS

CN 105515412 A 4/2016
EP 1 808 953 A1 7/2007
(Continued)

OTHER PUBLICATIONS

Dec. 14, 2017 Extended Search Report issued in European Patent Application No. 17183563.0.
(Continued)

*Primary Examiner* — Eduardo Colon Santana
*Assistant Examiner* — Zemenay T Truneh
(74) *Attorney, Agent, or Firm* — Oliff PLC

(57) ABSTRACT

An electric working machine according to one aspect of the present disclosure comprises a motor, a rectifier circuit, a capacitor, a series switching element, a resistive element, a drive circuit, a peak voltage value acquirer, and a controller. The capacitor smooths power rectified by the rectifier circuit. The series switching element is coupled in series with the capacitor. The resistive element is coupled in parallel with the series switching element. The controller brings the series switching element into conduction in a case where AC power is inputted to the rectifier circuit and where a specified conducting condition based on a peak voltage value acquired by the peak voltage value acquirer is satisfied.

11 Claims, 11 Drawing Sheets

(51) Int. Cl.
*H02H 9/00* (2006.01)
*H02P 6/20* (2016.01)
*H02M 1/36* (2007.01)
*H02M 7/06* (2006.01)
*H03K 5/1536* (2006.01)
*H03K 17/567* (2006.01)
*H02M 1/42* (2007.01)

(52) U.S. Cl.
CPC ............ *H02P 6/20* (2013.01); *H02P 29/0241* (2016.02); *H03K 5/1536* (2013.01); *H03K 17/567* (2013.01); *H02M 1/4225* (2013.01)

(58) Field of Classification Search
CPC .. H02M 1/4225; H03K 5/1536; H03K 17/567
USPC .......................................... 318/400.3; 363/89
See application file for complete search history.

(56) References Cited

U.S. PATENT DOCUMENTS

| 2016/0072403 A1* | 3/2016 | Niwa | .................. H02M 1/4225 363/89 |
| 2016/0190960 A1* | 6/2016 | Kawai | ...................... H02P 6/14 318/400.03 |

FOREIGN PATENT DOCUMENTS

| JP | H07-99775 | A | 4/1995 |
| JP | H10-136674 | A | 5/1998 |
| JP | H11-285252 | A | 10/1999 |
| JP | 2012-175882 | A | 9/2012 |
| JP | 2013-162719 | A | 8/2013 |
| JP | 2013-242081 | A | 12/2013 |
| JP | 2016-086639 | A | 5/2016 |
| WO | 2016/100891 | A1 | 6/2016 |

OTHER PUBLICATIONS

Feb. 4, 2020 Office Action issued in Japanese Patent Application No. 2016-149991.

* cited by examiner

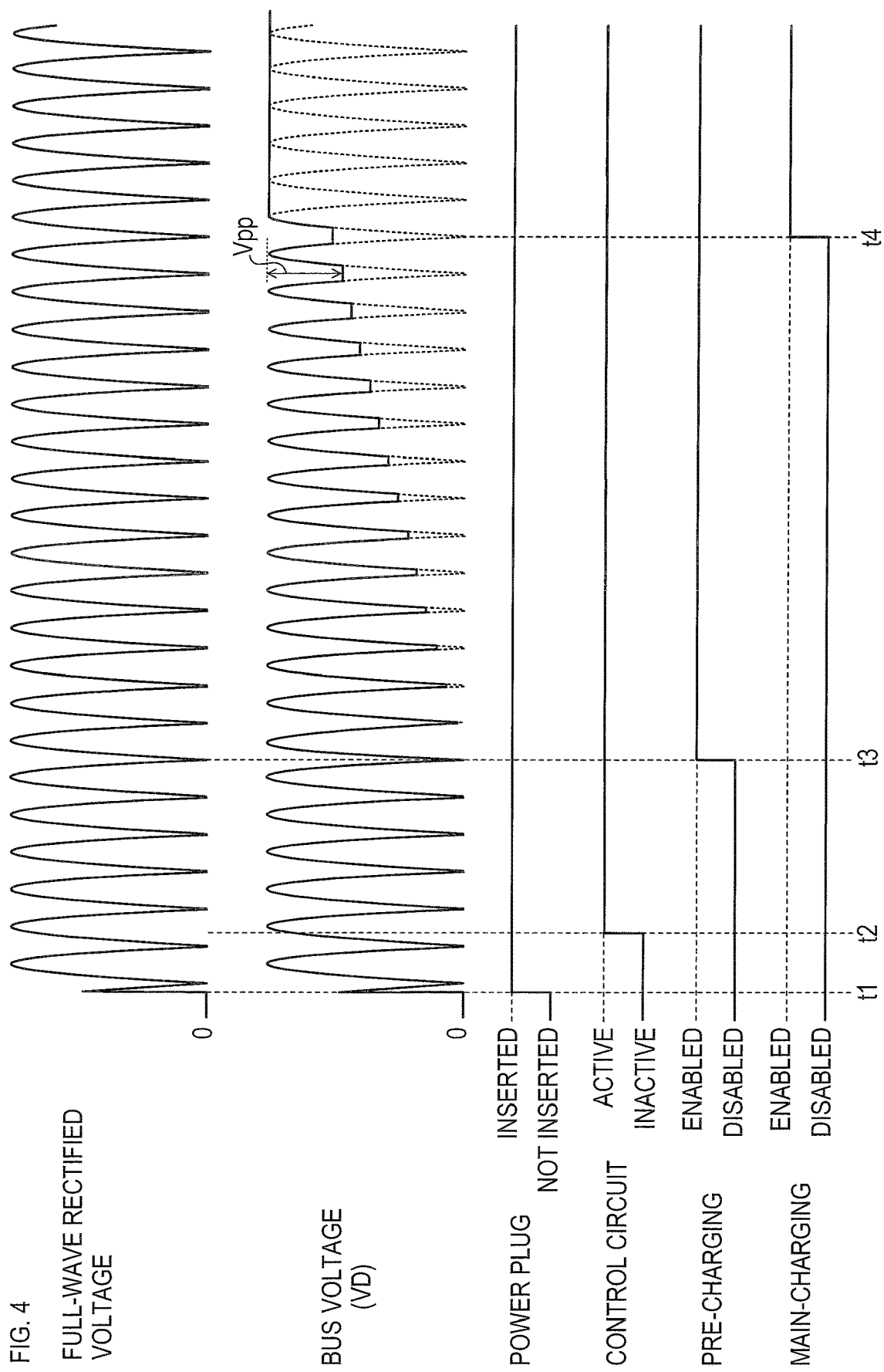

FIG. 9

| VDmax [V] | SET TIME TS [ms] |
|---|---|
| ~ 80 | 200 |
| 80 ~ 90 | 220 |
| 90 ~ 100 | 230 |
| 100 ~ 110 | 250 |
| 110 ~ 120 | 260 |
| 120 ~ 130 | 280 |
| 130 ~ | 300 |

ELECTRIC WORKING MACHINE AND METHOD FOR SMOOTHING AC POWER SUPPLIED THERETO

CROSS-REFERENCE TO RELATED APPLICATIONS

This application claims the benefit of Japanese Patent Application No. 2016-149991 filed on Jul. 29, 2016 with the Japan Patent Office, the entire disclosure of which is incorporated herein by reference.

BACKGROUND

The present disclosure relates to an electric working machine configured such that AC power is rectified by a rectifier circuit to drive a motor.

Japanese Unexamined Patent Application Publication No. 2016-086639 discloses an electric power tool configured such that a motor is driven by an inverter circuit. In the electric power tool, an inputted AC voltage is rectified by a rectifier circuit, the rectified AC voltage is smoothed by a smoothing capacitor, and the smoothed AC voltage is supplied to the inverter circuit.

SUMMARY

In the above-described electric power tool, it is preferred that fluctuations in voltage inputted to the inverter be small in order to drive the motor efficiently. Fluctuations in voltage inputted to the inverter can be reduced by, for example, increasing capacitance of the smoothing capacitor.

However, the more the capacitance of the smoothing capacitor is increased, the larger the value of an inrush current flowing through the smoothing capacitor becomes at the start of input of the AC voltage. Further, the period of time in which the inrush current flows becomes longer as well.

In a known technique that enables suppression of the inrush current at the start of input of the AC current, a switching element is coupled in series with the smoothing capacitor, and a resistive element is coupled in parallel with the switching element.

With this technique, a charging current flows through the smoothing capacitor and the resistive element to thereby charge the smoothing capacitor by keeping the switching element OFF immediately after the AC current is inputted to activate the electric power tool. This charging current is regulated by the resistive element, and thus, flowing of large inrush current through the smoothing capacitor is inhibited.

On the other hand, in order for smoothing by the smoothing capacitor to be efficiently performed while reducing loss, the switching element is turned ON so that the charging current may flow through the switching element via the smoothing capacitor.

However, a large current could possibly flow through the smoothing capacitor when the switching element is turned ON to thereby damage various elements and so on if a timing of turning the switching element ON is improper.

In one aspect of the present disclosure, it is desirable to be able to inhibit a large current from flowing through a capacitor when an AC power is inputted to an electric working machine.

An electric working machine according to one aspect of the present disclosure comprises a motor, a rectifier circuit, a capacitor, a series switching element, a resistive element, a drive circuit, a peak voltage value acquirer, and a controller.

The rectifier circuit is configured to rectify an AC power inputted from an AC power supply and to output a rectified power. The AC power fluctuates periodically. The capacitor is configured to be charged by the rectified power outputted from the rectifier circuit and to smooth the rectified power. The series switching element is a switching element coupled in series with the capacitor. The resistive element is coupled in parallel with the series switching element. The drive circuit is configured to drive the motor based on power smoothed by the capacitor. The peak voltage value acquirer is configured to acquire a peak voltage value, which is a maximum absolute value of a voltage of the AC power.

The controller is configured to bring the series switching element into conduction in a case where the AC power is inputted to the rectifier circuit and where a specified conducting condition based on the peak voltage value acquired by the peak voltage value acquirer is satisfied.

According to the thus-configured electric working machine, the conducting condition is set based on the peak voltage value after the AC power is inputted to the rectifier circuit. Then, the series switching element is brought into conduction when the conducting condition is satisfied. Accordingly, it can be inhibited that a large current flows through the capacitor when the series switching element is brought into conduction since the series switching element is brought into conduction at an appropriate timing.

The electric working machine may further comprise a capacitor voltage value acquirer. The capacitor voltage value acquirer is configured to acquire a capacitor voltage value. The capacitor voltage value is a value of a charging voltage in the capacitor. The conducting condition may comprise a condition that a difference between the peak voltage value acquired by the peak voltage value acquirer and the capacitor voltage value acquired by the capacitor voltage value acquirer is smaller than or equal to a difference threshold value.

In this case, the series switching element is brought into conduction when charging of the capacitor progresses and the difference between the peak voltage value of the AC power applied to the capacitor and the actual capacitor voltage value of the capacitor has become smaller than or equal to the difference threshold value. Accordingly, the series switching element can be brought into conduction in the state in which the difference between the peak voltage value and the capacitor voltage value has become small, and thus, the series switching element can be brought into conduction at a more appropriate timing. In addition, even in the event of rise and fall of the voltage of the AC power, an inrush current can be suppressed stably.

In the case where the electric working machine is configured such that the conducting condition is set based on the difference between the peak voltage value and the capacitor voltage value as described above, the electric working machine may further comprise a current path and a voltage detector. The current path is configured to input the rectified power outputted from the rectifier circuit to the capacitor. The voltage detector is configured to output a signal indicating a voltage value in the current path. The peak voltage value acquirer may be configured to acquire the peak voltage value based on the signal outputted from the voltage detector. The capacitor voltage value acquirer may be configured to acquire the capacitor voltage value based on the signal outputted from the voltage detector.

In this case, for example, in a state in which the voltage value in the current path is increased and decreased periodically, when the voltage value has become the maximum value, the peak voltage value acquirer can acquire the maximum value as the peak voltage value. Similarly, for example, in the state in which the voltage value in the current path is increased and decreased periodically, when the voltage value has become the minimum value, the capacitor voltage value acquirer can acquire the minimum value as the capacitor voltage value.

The electric working machine may further comprise a parallel switching element. The parallel switching element is a switching element coupled in series with the resistive element and coupled in parallel with the series switching element. The controller may be configured to bring the parallel switching element into conduction when the AC power is inputted to the rectifier circuit, and to subsequently bring the series switching element into conduction when the conducting condition is satisfied.

In this case, in addition to being able to appropriately set the timing of conduction of the series switching element, the controller can also adjust as appropriate the timing of starting flowing of the charging current via the resistive element prior to such conduction of the series switching element.

In the case where the electric working machine comprises the parallel switching element, the electric working machine may further comprise a zero-cross detector. The zero-cross detector is configured to detect a zero-cross of a detection target. The detection target is a voltage or a current of the AC power. The controller may be configured to bring the parallel switching element into conduction within a specified period of time after the zero-cross is detected by the zero-cross detector. The specified period of time may be a period of time from detection of the zero-cross until a specified timing that is before a value of the detection target first reaches a peak value.

The controller may be configured to bring the parallel switching element into conduction immediately after the zero-cross is detected by the zero-cross detector. "Immediately after the zero-cross is detected" is "immediately after the value of the detection target has become zero". Accordingly, by bringing the parallel switching element into conduction in such a state, it can be inhibited more effectively that a large current flows through the capacitor when the parallel switching element is brought into conduction.

"Immediately after" mentioned here need not be strictly "immediately after". For example, a configuration may be adopted in which, in a state where the value of the detection target is still within a low level of a certain degree after detection of the zero-cross, the parallel switching element is brought into conduction after a specified process is performed.

In the case where the electric working machine comprises the parallel switching element, the electric working machine may comprise the zero-cross detector, and the controller may be configured to bring the parallel switching element into conduction when the zero-cross is detected a prescribed number of times or more by the zero-cross detector after start of input of the AC power to the rectifier circuit.

In this case, after start of input of the AC power to the electric working machine, the parallel switching element is brought into conduction to thereby allow the charging current to flow through the capacitor upon confirmation that the AC power is being inputted. Accordingly, when the electric working machine is connected to the AC power supply, the occurrence of sparks given off from the connection can be reduced.

In the case where the electric working machine comprises the parallel switching element, the electric working machine may comprise the zero-cross detector, and the controller may be configured to bring the parallel switching element out of conduction when the zero-cross is not detected by the zero-cross detector continuously for a prescribed time or longer.

In the case where the parallel switching element is brought out of conduction when the zero-cross is not detected continuously for the prescribed time or longer, the charging path to the capacitor is interrupted. Accordingly, when the electric working machine is again connected to the AC power supply, the occurrence of sparks given off from the connection can be reduced.

The controller may determine the timing of conduction of the series switching element based on other conditions in addition to the conducting condition. For example, the controller may be configured to bring the series switching element into conduction in a case where the conducting condition is satisfied and where a voltage value of the rectified power outputted from the rectifier circuit is smaller than or equal to the capacitor voltage value.

In this case, when the series switching element is brought into conduction, the value of the output voltage of the rectifier circuit is smaller than or equal to the value of the charging voltage across the capacitor. Accordingly, it can be effectively inhibited that a large current flows from the rectifier circuit to the capacitor.

Moreover, for example, the electric working machine may comprise the zero-cross detector configured to detect a zero-cross of a detection target. The detection target is a voltage or a current of the AC power. The controller may be configured to bring the series switching element into conduction when the conducting condition is satisfied and within a specified period of time that is after the zero-cross is detected by the zero-cross detector. The specified period of time may be a period of time from detection of the zero-cross until a specified timing that is before a value of the detection target first reaches a peak value.

The controller may be configured, when the conducting condition is satisfied, to bring the series switching element into conduction immediately after the zero-cross is detected by the zero-cross detector. By bringing the series switching element into conduction immediately after detection of the zero-cross, that is, immediately after the value of the detection target has become zero, it can be effectively inhibited that a large current flows to the capacitor when the series switching element is brought into conduction. "Immediately after" mentioned here also need not be strictly "immediately after".

The controller may be configured to bring the series switching element out of conduction when the zero-cross is not detected continuously for a prescribed time or longer. In this case, it can be inhibited that the series switching element is kept in conduction despite the electric working machine not being connected to the AC power supply. Accordingly, it can be effectively inhibited that, when the electric working machine is connected to the AC power supply, sparks are given off from the connection.

The controller may be configured to determine a set time to be used as the conducting condition, based on the peak voltage value acquired by the peak voltage value acquirer. In this case, the conducting condition may comprise a condition that the set time elapses from a specified time measurement start timing that is after start of input of the AC power to the rectifier circuit.

In this case, since the set time is determined based on the peak voltage value, the series switching element can be brought into conduction in the state in which the difference between the peak voltage value of the AC power applied to the capacitor and the actual capacitor voltage value of the capacitor has become moderately small. Accordingly, the controller can bring the series switching element into conduction at an appropriate timing.

Also in the case where the conducting condition is that the set time elapses from the time measurement start timing as described above, the electric working machine may further comprise a parallel switching element. The parallel switching element is coupled in parallel with the series switching element. The controller may be configured to bring the parallel switching element into conduction when input of the AC power to the rectifier circuit is started, and to subsequently bring the series switching element into conduction when the conducting condition is satisfied. The time measurement start timing may be a timing at which the parallel switching element is brought into conduction.

In this case, the timing of bringing the series switching element into conduction is set based on the timing of starting the charging of the capacitor via the resistive element. Accordingly, the controller can bring the series switching element into conduction at a more appropriate timing.

The controller may be configured to determine the set time such that the larger the peak voltage value is, the longer the set time is. It can be conceivable that the larger the peak voltage value is, the longer the time required to bring the value of the charging voltage across the capacitor closer to the peak voltage value is. Accordingly, by determining the set time such that the larger the peak voltage value is, the longer the set time is, the series switching element can be brought into conduction in the state in which the difference between the peak voltage value and the value of the charging voltage across the capacitor has become small to a necessary and sufficient extent.

Another aspect of the present disclosure is a method for smoothing an AC power fluctuating periodically supplied to an electric working machine.

The electric working machine comprises:

a motor;

a rectifier circuit configured to rectify the AC power and to output a rectified power;

a capacitor configured to be charged by the rectified power outputted from the rectifier circuit and to smooth the rectified power;

a switching element coupled in series with the capacitor;

a resistive element coupled in parallel with the switching element; and a drive circuit configured to drive the motor based on a power smoothed by the capacitor.

The method comprises:

acquiring a peak voltage value, which is a maximum absolute value of a voltage of the AC power; and bringing the switching element into conduction when a specified conducting condition based on the peak voltage value is satisfied.

Such a method can also exert effects similar to those of the above-described electric working machine.

BRIEF DESCRIPTION OF THE DRAWINGS

Example embodiments of the present disclosure will be described below by way of example with reference to the accompanying drawings, in which:

FIG. 4 is an explanatory diagram showing a charging state of a smoothing capacitor in the electric working machine of the first embodiment after insertion of a power plug;

FIG. 9 is an explanatory diagram showing a set time table of the third embodiment.

DETAILED DESCRIPTION OF THE PREFERRED EMBODIMENTS

1. First Embodiment (1-1) Overall Structure of Electric Working Machine 1

Figure 1:
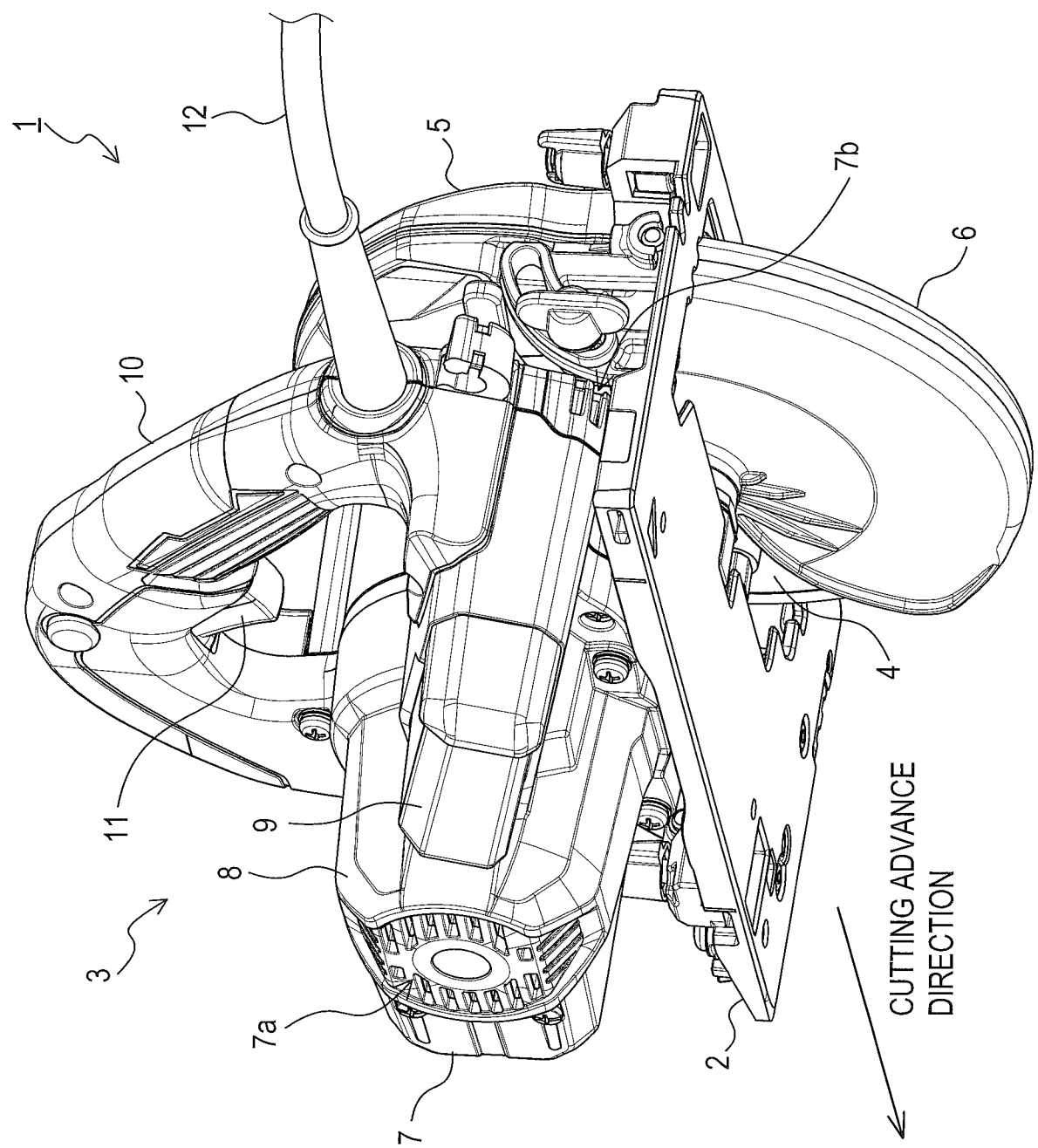
FIG. 1 is a perspective view showing an electric working machine of a first embodiment.

As shown in FIG. 1, an electric working machine 1 of the present embodiment, which is configured as a circular saw, comprises a base 2 and a main body 3. The base 2 is a substantially rectangular member to be brought into contact with an upper surface of a workpiece when cutting operation is performed on the workpiece by means of the electric working machine 1. The main body 3 is mainly arranged on an upper surface side of the base 2.

The main body 3 comprises a saw blade 4 of a circular shape, a saw blade case 5, a cover 6, a body casing 7, and a handle 10. The saw blade 4 is arranged on the right side of the main body 3 with respect to a cutting advance direction. The saw blade case 5 is provided so as to cover and contain therein substantially an upper half of the saw blade 4. The cover 6 is provided so as to cover substantially a lower half of the saw blade 4.

The cover 6 is designed to open and close, and FIG. 1 shows a state in which the cover 6 is closed. By moving the electric working machine 1 in the cutting advance direction while cutting the workpiece, the cover 6 is rotated in a counterclockwise direction in FIG. 1 about a rotation center of the saw blade 4, to thereby be gradually opened. As a result, the saw blade 4 is exposed, and an exposed part of the saw blade 4 cuts into the workpiece.

The body casing 7 is arranged on the left side of the main body 3 with respect to the cutting advance direction. The body casing 7 comprises a motor container 8 of a substantially cylindrical shape and a controller container 9 of a substantially cuboidal shape.

Figure 2:
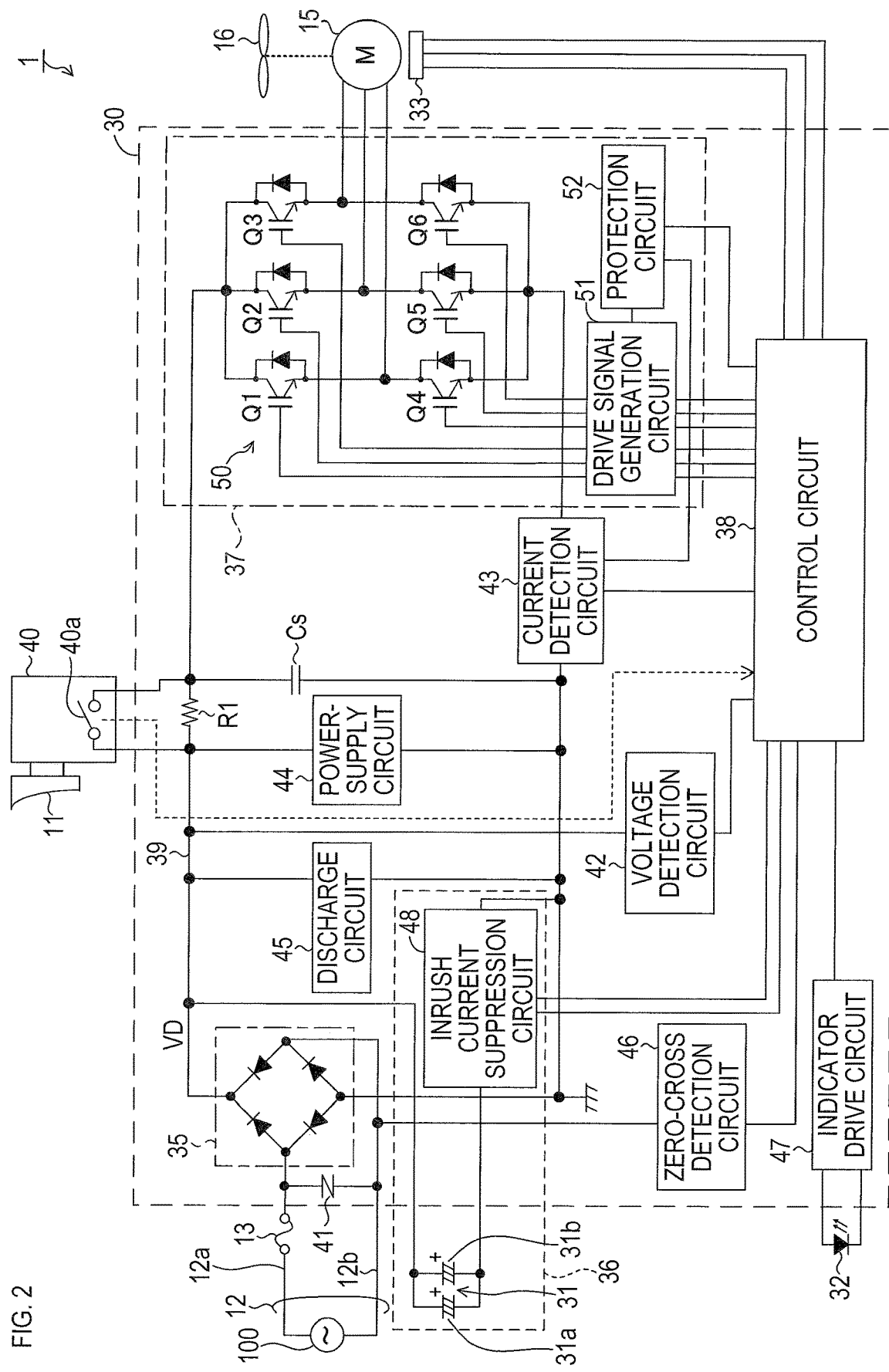
FIG. 2 is an electric circuit diagram of the electric working machine of the first embodiment.

The motor container 8 contains therein a motor 15 (see FIG. 2). The motor 15 is a drive source to rotate the saw blade 4. The controller container 9 contains therein a controller 30 (see FIG. 2). The controller 30 controls driving of the motor 15.

In the main body 3, provided between the motor container 8 and the saw blade 4 is a not-shown gear mechanism. The gear mechanism decelerates rotation of the motor 15 and transmits the decelerated rotation to the saw blade 4. The body casing 7 has a first air vent 7a arranged in a left lateral face of the motor container 8 with respect to the cutting advance direction, and has a second air vent 7b arranged in a rear end face of the controller container 9 with respect to the cutting advance direction.

The handle 10 to be grabbed by a user of the electric working machine 1 is provided to the main body 3 so as to form an arch-like shape. A first end of the handle 10 is fixed on a rear end side of the main body 3 with respect to the cutting advance direction, and a second end of the handle 10 is fixed to the main body 3 at a position forward relative to the first end with respect to the cutting advance direction. In the present embodiment, the main body 3 and the handle 10 are integrally formed of, for example, a resin material.

The handle 10 has an operation switch 11 of a trigger type provided on a side thereof facing the body casing 7. The user of the electric working machine 1 can operate the operation switch 11 while grabbing the handle 10. Further, when the user presses down a not-shown lock button while performing a pulling operation of the operation switch 11, the operation switch 11 can be locked in such a pulled state.

From a rear end of the main body 3 with respect to the cutting advance direction, a power cord 12 is drawn out. Provided at a leading end of the power cord 12 is a not-shown power plug. The power cord 12 is a cord to take in electric power for driving the motor 15.

(1-2) Electrical Configuration of Electric Working Machine 1

An electrical configuration of the electric working machine 1 will now be described with reference to FIGS. 2 and 3. As shown in FIG. 2, the electric working machine 1 comprises the motor 15, the controller 30, a smoothing capacitor 31, an indicator 32, and a switch body 40.

When the power plug provided at the leading end of the power cord 12 is inserted into a socket of an external power supply, that is, an AC power supply 100, AC power is inputted from the AC power supply 100 to the controller 30 via the power cord 12. The power cord 12 comprises electric wires 12a and 12b. The electric wire 12a is provided with a fuse 13. When a current flowing through the electric wire 12a becomes excessively large to fuse the fuse 13, the electric wire 12a is broken, to thereby block input of AC power to the controller 30.

The motor 15 is a brushless motor in the present embodiment. The motor 15, which is coupled to an inverter 50 in the controller 30, is rotationally driven by being supplied with current from the inverter 50. Coupled to the motor 15 is a fan 16 to cool down the motor 15. Rotation of the motor 15 causes rotation of the fan 16.

The motor 15 comprises a rotation sensor 33 that detects a rotational position of the motor 15. The rotation sensor 33 of the present embodiment comprises three Hall sensors. These Hall sensors are arranged around a rotor of the motor 15 so as to be separated from each other by an electric angle of 120 degrees. Signals from these Hall sensors are inputted to a control circuit 38 in the controller 30.

More specifically, the smoothing capacitor 31 of the present embodiment comprises capacitors 31a and 31b, which are coupled in parallel with each other. Thus, capacitance of the smoothing capacitor 31 is parallel-combined capacitance of the capacitors 31a and 31b. The capacitors 31a and 31b are each an electrolytic capacitor in the present embodiment.

Instead of the capacitors 31a and 31b, the smoothing capacitor 31 may comprise a single capacitor, or may comprise a plurality of capacitors coupled to one another in parallel, in series, or in series and parallel.

The indicator 32 visually indicates various information to the user of the electric working machine 1. The indicator 32 comprises an LED in the present embodiment. The indicator 32 is controlled by the controller 30.

The switch body 40 is a member to perform electrical output corresponding to an operation state of the operation switch 11 by the user, and comprises at least a switch contact 40a. The switch contact 40a is provided on a bus line 39 leading from a rectifier circuit 35 to the inverter 50, and electrically completes or interrupts the bus line 39. In the present embodiment, however, a resistor R1 is coupled in parallel with the switch contact 40a on the bus line 39, and thus, the bus line 39 is not completely interrupted even when the switch contact 40a is turned OFF.

In a state in which the pulling operation of the operation switch 11 is not performed, the switch contact 40a enters an OFF state to interrupt the bus line 39. On the other hand, in a state in which the pulling operation of the operation switch 11 is performed, the switch contact 40a enters an ON state to complete the bus line 39. Further, the switch body 40 is configured to output to the control circuit 38 in the controller 30 an operation signal indicating whether the pulling operation of the operation switch 11 has been performed. The operation signal in the present embodiment is an electrical signal indicating the ON state or the OFF state of the switch contact 40a.

The controller 30 is configured to convert the AC power supplied from the AC power supply 100 into electric power for driving the motor 15 and to supply the converted power to the motor 15. Various circuits in the controller 30 of the present embodiment and their components may be mounted on a single circuit board.

The controller 30 comprises the rectifier circuit 35, a smoothing circuit 36, an intelligent power module (IPM) 37, the control circuit 38, a voltage detection circuit 42, a current detection circuit 43, a power-supply circuit 44, a discharge circuit 45, a zero-cross detection circuit 46, and an indicator drive circuit 47.

The rectifier circuit 35 comprises a diode bridge. The diode bridge comprises four diodes, and full-wave rectifies the AC power inputted to the rectifier circuit 35. The electric power rectified by the rectifier circuit 35 is outputted to the bus line 39.

The smoothing circuit 36 smooths the rectified electric power, which has been outputted from the rectifier circuit 35. The smoothing circuit 36 comprises the smoothing capacitor 31 and an inrush current suppression circuit 48. A first end of the smoothing capacitor 31 is coupled to the bus line 39, and a second end of the smoothing capacitor 31 is coupled to the inrush current suppression circuit 48. In the present embodiment, the smoothing capacitor 31 is not mounted on the circuit board of the controller 30, and is arranged separately from the circuit board of the controller 30.

Figure 3:
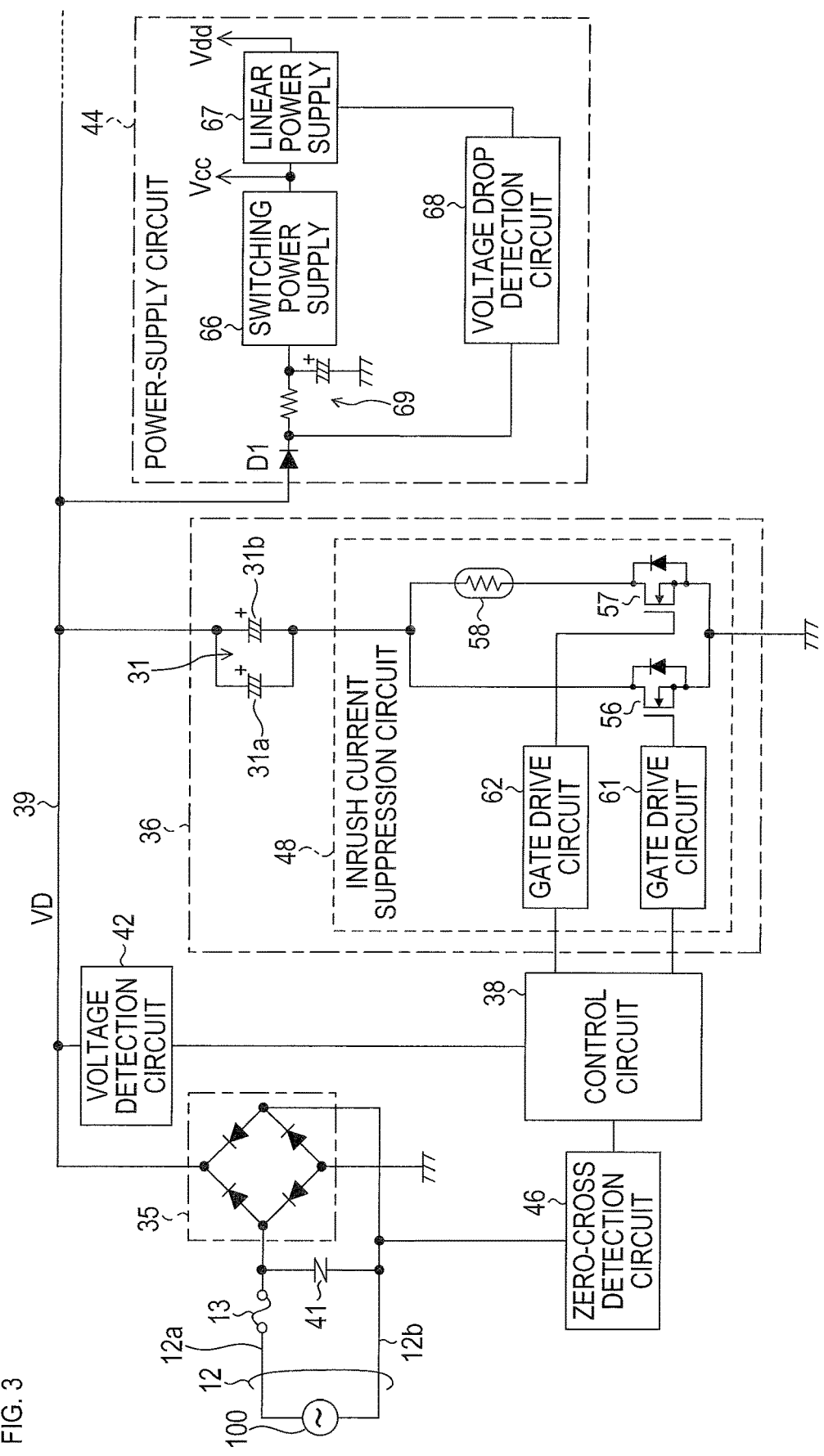
FIG. 3 is an electric circuit diagram of a part extracted from the electric circuit diagram in FIG. 2, particularly showing detailed configurations of an inrush current suppression circuit and a power-supply circuit.

More specifically, as shown in FIG. 3, the inrush current suppression circuit 48 comprises a first switching element 56, a second switching element 57, a resistive element 58, and gate drive circuits 61 and 62. The first switching element 56 and the second switching element 57 are each an N-channel MOSFET in the present embodiment.

The first switching element 56 is provided in series with the smoothing capacitor 31 on a current path leading from the bus line 39 through the smoothing capacitor 31 to a ground line. Specifically, a drain of the first switching element 56 is coupled to the second end of the smoothing capacitor 31, and a source of the first switching element 56 is coupled to the ground line.

While the second switching element 57 and the resistive element 58 are coupled in series with each other, they are coupled in parallel with the first switching element 56. More specifically, a first end of the resistive element 58 is coupled to the drain of the first switching element 56, and a second end of the resistive element 58 is coupled to a drain of the second switching element 57. A source of the second switching element 57 is coupled to the ground line.

The resistive element 58 is a PTC thermistor in the present embodiment. However, the PTC thermistor is one example of the resistive element 58, and the resistive element 58 may be a resistive element other than the PTC thermistor.

The first switching element 56 is turned ON and OFF via the gate drive circuit 61 in accordance with a drive command from the control circuit 38. The second switching element 57 is turned ON and OFF via the gate drive circuit 62 in accordance with a drive command from the control circuit 38. The first switching element 56 is brought into conduction when turned ON, and is brought out of conduction when turned OFF.

According to such a configuration, when the AC power is being inputted to the rectifier circuit 35 via the power cord 12, the charging current flows through the smoothing capacitor 31, the resistive element 58, and the second switching element 57 to thereby charge the smoothing capacitor 31 upon turning ON of the second switching element 57. On the other hand, the charging current flows through the smoothing capacitor 31 and the first switching element 56 to thereby charge the smoothing capacitor 31 upon turning ON of the first switching element 56.

That is, when either one of the first switching element 56 or the second switching element 57 is turned ON, the charging current flows through the smoothing capacitor 31 to thereby charge the smoothing capacitor 31.

It is to be noted that, since the resistive element 58 is coupled in series with the second switching element 57, the value of the charging current when the second switching element 57 is turned ON in a state in which the first switching element 56 is OFF is kept lower than the value of the charging current at the time when the first switching element 56 is turned ON.

Returning to FIG. 2, the IPM 37 comprises, within a single package thereof, the inverter 50, a drive signal generation circuit 51, and a protection circuit 52.

The inverter 50 switches conduction states of respective phase coils of the motor 15 and controls conduction currents flowing through the respective phase coils, to thereby rotationally drive the motor 15. The inverter 50 comprises switching elements Q1, Q2, and Q3, which are provided as high-side switches, and switching elements Q4, Q5, and Q6, which are provided as low-side switches.

The switching elements Q1, Q2, and Q3 are each provided between the corresponding phase coil of the motor 15 and the bus line 39. The switching elements Q4, Q5, and Q6 are each provided between the corresponding phase coil of the motor 15 and the ground line.

The switching elements Q1 to Q6 are insulated gate bipolar transistors (IGBTs) in the present embodiment. However, the IGBTs are just one example of the switching elements Q1 to Q6, and the switching elements Q1 to Q6 may be switching elements of other types.

The drive signal generation circuit 51 turns the switching elements Q1 to Q6 in the inverter 50 ON and OFF individually in accordance with the drive commands from the control circuit 38. The switching elements Q1 to Q6 are brought into conduction when turned ON, and are brought out of conduction when turned OFF. When the electric working machine 1 has entered a specified state, the protection circuit 52 causes the drive signal generation circuit 51 to stop the motor 15 by forcibly turning the switching elements Q1 to Q6 OFF, and outputs an error signal to the control circuit 38. Examples of the specified state may include occurrence of, for example, an overheat abnormality in the IPM 37, detection of an abnormality in the power-supply circuit 44 based on a control voltage Vcc inputted to the IPM 37, and detection of overcurrent based on a current detection signal from the current detection circuit 43, as will be described later.

The motor 15 of the present embodiment is a high rotation type motor. One reason for adopting the high rotation type motor as the motor 15 is to enable feedback control (i.e., constant rotation control) so that the motor 15 may have a constant rotational speed by pulse-width modulation (PWM) driving, and further to expand, as wide as possible, the load region in which the rotational speed of the motor 15 can be maintained constant. In the present embodiment, degradation in the rotational speed due to load in the practical region is inhibited by using a motor that can be rotated at a high rotational speed relative to another motor with respect to the same current value.

The maximum rotational speed of the motor 15 of the present embodiment is, for example, 5,000 rpm or more, which is measured as the rotational speed of the saw blade 4, and is controlled to maintain, for example, 4,000 rpm to 4,500 rpm by the constant rotation control.

Moreover, in the present embodiment, in order to inhibit reduction of torque while maintaining the high rotational speed, the value of the current flowing through the motor 15 when driving the motor 15 is set at a relatively large value. To flow a current having a large current value through the high rotation type motor makes it possible to maintain necessary and sufficient torque even at high rotational speeds. As a result, a sufficient load region can be secured in which the rotational speed can be maintained constant.

Furthermore, in the present embodiment, a capacitor having a middle capacitance is used as the smoothing capacitor 31. Such a capacitor has electrostatic capacity of, for example, around 1,000 µF (e.g., a value in the range of 470 µF to 2,000 µF).

The use of the capacitor having the middle capacitance as the smoothing capacitor 31 makes it possible to suppress peak current in the current flowing through the motor 15, to thereby reduce current ripple, as compared with a case where a capacitor having small capacitance is used. This makes it possible to raise an average value of the current that can flow without causing the protection circuit 52 within the IPM 37 to perform an overcurrent protection function. As a result, the maximum torque (the maximum output) of the motor 15 can be increased. In addition, effective reduction of current ripple enables inhibition of demagnetization of a permanent magnet used in the motor 15, and the motor 15 can be designed to be smaller.

Still further, in the present embodiment, the IPM 37 is provided as a drive circuit for the motor 15. The IPM 37 comprises the above-described switching elements Q1 to Q6. These switching elements Q1 to Q6 are contained in a single package. To use the IPM 37 as the drive circuit is just one example. Each of the switching elements Q1 to Q6 may be, for example, a discrete component, and may be mounted individually on the circuit board.

The IPM 37 is configured such that heat generated by the switching elements Q1 to Q6 can be radiated efficiently. In addition, since the switching elements Q1 to Q6 can be handled as a single component, arrangement on the circuit board is highly flexible. In sum, in the present embodiment, the IPM 37 is adopted as the drive circuit for the motor 15 with the aim of maintaining necessary heat radiation performance while increasing flexibility in arrangement of the components.

The use of the high rotation type motor as the motor 15 and the capacitor having a middle capacitance as the smoothing capacitor 31 is just one example.

The voltage detection circuit 42, which is coupled to the bus line 39, detects a bus voltage value VD, which is a voltage value of the bus line 39, and outputs to the control circuit 38 a voltage detection signal indicating the detected bus voltage value VD.

The current detection circuit 43 is provided on a current path leading from the inverter 50 to the ground line. The current detection circuit 43 detects a load current value, which is the value of load current flowing through this current path. The current detection circuit 43 outputs a current detection signal indicating the detected load current value to the control circuit 38 and the protection circuit 52. The protection circuit 52 monitors the load current value on the basis of the current detection signal inputted from the current detection circuit 43. When the load current value exceeds a threshold value, the protection circuit 52 forcibly turns the switching elements Q1 to Q6 OFF regardless of the contents of the drive command from the control circuit 38.

The power-supply circuit 44 generates electric power for operating the respective elements within the controller 30. More specifically, as shown in FIG. 3, the power-supply circuit 44 comprises a switching power supply 66, a linear power supply 67, and a voltage drop detection circuit 68.

The electric power smoothed by the smoothing circuit 36 is inputted to the switching power supply 66 through the bus line 39 and via a diode D1 and a filter circuit 69. The switching power supply 66 generates the control voltage Vcc having a specified DC voltage value on the basis of the inputted electric power, and outputs the generated control voltage Vcc. The control voltage Vcc is supplied to the respective elements within the controller 30, including the IPM 37 and the inrush current suppression circuit 48, and is used for operation of the respective elements.

The control voltage Vcc is also inputted to the linear power supply 67. The linear power supply 67 generates a control voltage Vdd having a specified DC voltage value on the basis of the inputted control voltage Vcc, and outputs the generated control voltage Vdd. The control voltage Vdd generated by the linear power supply 67 is supplied to the respective elements within the controller 30, including the control circuit 38, and is used for operation of the respective elements.

When the value of the input voltage inputted to the power-supply circuit 44 is decreased to a value indicating that the control voltage Vcc and the control voltage Vdd cannot be maintained within normal ranges, the voltage drop detection circuit 68 causes the linear power supply 67 to stop output of the control voltage Vdd.

When the power plug is pulled out to thereby stop input of the AC power to the electric working machine 1, the discharge circuit 45 promptly discharges the charging power of the smoothing capacitor 31 to thereby stop the motor 15 promptly. The discharge circuit 45 of the present embodiment comprises, for example, a resistor. A first end of this resistor is coupled to the bus line 39, and a second end of this resistor is coupled to the ground line.

The zero-cross detection circuit 46 detects the voltage value of the AC power inputted from the AC power supply 100 to thereby detect a zero-cross point of the value of the AC voltage. In other words, the zero-cross detection circuit 46 detects a timing at which the value of the AC voltage becomes 0. Alternatively, the zero-cross detection circuit 46 detects the current value of the AC power inputted from the AC power supply 100 to thereby detect a zero-cross point of the value of the AC current. In other words, the zero-cross detection circuit 46 detects a timing at which the value of the AC current becomes 0. Each time the zero-cross detection circuit 46 detects the zero-cross point, the zero-cross detection circuit 46 outputs to the control circuit 38 a zero-cross detection signal indicating that the zero-cross point has been detected.

The indicator drive circuit 47 drives the indicator 32 in accordance with an indicator control signal from the control circuit 38. The indicator drive circuit 47 can cause the indicator 32 to, for example, emit a green light, emit a red light, or blink the light.

In the bus line 39, the switch contact 40a is coupled downstream of a position where the smoothing circuit 36 is coupled. When the switch contact 40a is ON, the electric power smoothed by the smoothing circuit 36 is inputted to the IPM 37 via the switch contact 40a.

Coupled between a path in the bus line 39 between the switch contact 40a and the IPM 37 and the ground line is a snubber capacitor Cs that removes or reduces high-frequency noise from the bus line 39. The snubber capacitor Cs is a non-polar capacitor and has much smaller capacitance than that of the smoothing capacitor 31.

If the switch contact 40a is arranged in the preceding stage of the smoothing circuit 36, charging of the smoothing capacitor 31 is started when the pulling operation of the operation switch 11 is performed to turn the switch contact 40a ON. Thus, start-up of the motor 15 is delayed.

In contrast, the switch contact 40a is arranged in the subsequent stage of the smoothing circuit 36 in the present embodiment. Due to such a configuration, charging of the smoothing capacitor 31 is performed upon insertion of the power plug, even when the pulling operation of the operation switch 11 is not performed. Thus, after insertion of the power plug, the motor 15 can be started promptly when the pulling operation of the operation switch 11 is performed to turn the switch contact 40a ON.

Further, in the bus line 39, the resistor R1 is coupled in parallel with the switch contact 40a. In the present embodiment, the resistor R1 has a relatively large resistance of, for example, several hundred kΩ. Due to existence of the resistor R1, the snubber capacitor Cs is charged in advance upon insertion of the power plug, even when the switch contact 40a is OFF.

Due to such a configuration, inrush current to the snubber capacitor Cs is suppressed when the pulling operation of the operation switch 11 is performed to turn the switch contact 40a ON after insertion of the power plug. Thus, even when chattering of the switch contact 40a occurs, welding failure of the switch contact 40a is inhibited.

In the controller 30, provided between the preceding stage of the rectifier circuit 35, that is, the fuse 13, and the rectifier circuit 35 is a varistor 41 that protects internal circuits of the controller 30 from overvoltage.

In a supply path of the AC power, the fuse 13 is arranged in the preceding stage of the varistor 41. Thus, in a case of a short-circuit failure of the varistor 41, blowout of the fuse 13 occurs to interrupt input of the AC power to the electric working machine 1.

The varistor 41 is arranged at a specified position within the controller container 9 shown in FIG. 1. This specified position may be a position where a body of the varistor 41 cannot be visually observed from outside of the electric working machine 1 through the second air vent 7b and where sparks given off from the varistor 41 in the event of the short-circuit failure of the varistor 41 also cannot be visually observed from outside of the electric working machine 1 through the second air vent 7b.

In the present embodiment, the control circuit 38 comprises a microcomputer comprising a CPU, a memory, and so on. The memory includes at least one of various semiconductor memories, such as a RAM, a ROM, and a flash memory. Various functions of the control circuit 38 are performed by the CPU's execution of programs stored in a non-transitory tangible storage medium. In this example, the memory corresponds to the non-transitory tangible storage medium in which the programs are stored.

The microcomputer provided in the control circuit 38 may be one in number, or may be two or more in number. Further, the functions of the control circuit 38 are performed not only by software. Some or all of the functions of the control circuit 38 may be performed by hardware configured with a logic circuit, an analog circuit, and so on combined together. More specifically, the control circuit 38 may be a combination of various individual electronic components, or may be an Application Specified Integrated Circuit (ASIC), Application Specific Standard Product (ASSP), or a programmable logic device such as a Field Programmable Gate Array (FPGA), or may be a combination thereof.

When the control circuit 38 detects the pulling operation of the operation switch 11 on the basis of the operation signal from the switch body 40, the control circuit 38 outputs, to the drive signal generation circuit 51 in the IPM 37, individual drive signals for the respective switching elements Q1 to Q6, to thereby drive the motor 15.

The control circuit 38 can detect the bus voltage value VD on the basis of the voltage detection signal inputted from the voltage detection circuit 42. The control circuit 38 can detect a timing of the zero-cross point on the basis of the zero-cross detection signal inputted from the zero-cross detection circuit 46.

The control circuit 38 controls operation of the indicator 32 via the indicator drive circuit 47. For example, the control circuit 38 causes the indicator 32 to illuminate green or to extinguish. Further, for example, when the control circuit 38 detects that the load current value indicates an overcurrent state on the basis of the current detection signal inputted from the current detection circuit 43, the control circuit 38 causes the indicator 32 to illuminate red. After the indicator 32 is caused to illuminate red, when the overcurrent state indicated by the load current value has continued for a specified period of time, the control circuit 38 forces the switching elements Q1 to Q6 OFF to stop the motor 15.

The control circuit 38 controls the inrush current suppression circuit 48 within the smoothing circuit 36 by executing an inrush current suppression processing, which will be described below. Specifically, the control circuit 38 individually controls the switching elements 56 and 57 in the inrush current suppression circuit 48 to be ON or OFF, to thereby control charging of the smoothing capacitor 31.

Here, a supplementary explanation will be given about differences between the overcurrent protection function of the control circuit 38 and the overcurrent protection function of the protection circuit 52 within the IPM 37.

The overcurrent protection function of the protection circuit 52 within the IPM 37 is to forcibly stop the motor 15 by directly causing the drive signal generation circuit 51 to forcibly turn the switching elements Q1 to Q6 OFF without involving the control circuit 38, when the load current value detected by the current detection circuit 43 exceeds the threshold value. This overcurrent protection function enables, for example, protection against an instantaneous current (for example, inhibition of demagnetization). Thus, the threshold value and responsiveness for this overcurrent protection function are higher than those for the overcurrent protection function of the control circuit 38.

On the other hand, the overcurrent protection function of the control circuit 38 enables, for example, protection against an average current (for example, protection against burnout of the motor 15, the IPM 37, and so on). In this case, the control circuit 38 may determine the overcurrent state when an average current value acquired from the load current value detected by the current detection circuit 43 is greater than or equal to a given threshold value. In this case, the indicator 32 may be caused to illuminate red as described above. Then, the control circuit 38 may stop driving of the motor 15 when the overcurrent state has continued for the specified period of time. The threshold value used for the overcurrent protection function of the control circuit 38 may be smaller than the threshold value used by the protection circuit 52 within the IPM 37.

(1-3) Outline of Operation of Smoothing Circuit

An explanation will be given below, with reference to FIG. 4, of an example of operation of the smoothing circuit 36 after the power plug is inserted into the socket of the AC power supply 100 to start input of AC power to the electric working machine 1.

Upon insertion of the power plug into the socket of the AC power supply 100 at a time t1, AC power is inputted to the controller 30. When AC power is inputted to the controller 30, the power-supply circuit 44 starts up to generate the control voltage Vcc and the control voltage Vdd, which are supplied to the respective elements within the controller 30. This causes the control circuit 38 to start up at a time t2.

After the start-up, the control circuit 38 detects a zero-cross on the basis of the zero-cross detection signal from the zero-cross detection circuit 46, and enables pre-charging at a time t3, that is, immediately after the Kth zero-cross is detected (Kth is a prescribed number of times the zero-cross is detected). FIG. 4 illustrates a case where the prescribed number of times Kth is, for example, five. In other words, FIG. 4 illustrates an example in which, after the control circuit 38 starts up at the time t2, the pre-charging is enabled after the zero-cross is detected five times.

The pre-charging refers to charging the smoothing capacitor 31 using the resistive element 58 and the second switching element 57 by turning ON the second switching element 57 within the inrush current suppression circuit 48. "Enabling" the pre-charging refers to turning the second switching element 57 ON. "Disabling" the pre-charging refers to turning the second switching element 57 OFF.

Before the pre-charging is started, the bus voltage value VD is equal to the full-wave rectified voltage value, which is the value of a voltage outputted from the rectifier circuit 35. On the other hand, upon start of the pre-charging at the time t3, the capacitor voltage value, which is the value of charging voltage across the smoothing capacitor 31, is gradually increased. Thus, the bus voltage value VD is equal to the full-wave rectified voltage value during a period of time in which the full-wave rectified voltage value is greater than or equal to the capacitor voltage value, and the bus voltage value VD is equal to the capacitor voltage value during a period of time in which the full-wave rectified voltage value is smaller than the capacitor voltage value.

Upon start of the pre-charging, the capacitor voltage value becomes closer to a peak voltage value of the AC power. The peak voltage value is the maximum absolute value of the voltage of the periodically fluctuating AC power. After start of the pre-charging, the control circuit 38 enables main-charging when a specified enabling condition is satisfied.

The main-charging refers to putting the smoothing capacitor 31 into a state chargeable using the first switching element 56 by turning ON the first switching element 56 within the inrush current suppression circuit 48. "Enabling" the main-charging refers to turning the first switching element 56 ON. "Disabling" the main-charging refers to turning the first switching element 56 OFF.

In the present embodiment, the pre-charging is continuously kept enabled even after the main-charging is enabled. However, the pre-charging may be disabled when the main-charging is enabled.

In the present embodiment, the enabling condition for starting the main-charging is that a difference Vpp, which is a difference between the peak voltage value and the capacitor voltage value, becomes smaller than or equal to a difference threshold value Vth. When the control circuit 38 detects, at a time t4, that the enabling condition is satisfied, that is, that the difference Vpp has become smaller than or equal to the difference threshold value Vth, the control circuit 38 enables the main-charging. Upon enabling of the main-charging, charging of the smoothing capacitor 31 progresses rapidly by the main-charging, and the smoothing capacitor 31 is charged to a level approximately equal to the peak voltage value of the AC power.

(1-4) Inrush Current Suppression Processing

Next, an explanation will be given below, with reference to a flowchart shown in FIGS. 5A and 5B, of the inrush current suppression processing performed by the control circuit 38 to achieve the operation of the smoothing circuit 36 shown in FIG. 4. Upon start-up, the control circuit 38 reads from the memory a program of the inrush current suppression processing shown in FIGS. 5A and 5B, and executes the program.

Upon start of the inrush current suppression processing, the control circuit 38 disables the pre-charging in S100, and disables the main-charging in S105. That is, the pre-charging and the main-charging are both to be surely disabled in an initial state after the start-up. In S110, the indicator 32 is turned OFF, that is, the LED is extinguished.

In S115, time measurement of a non-detection time Tz is started. The non-detection time Tz indicates duration of a state in which no zero-cross is detected.

In S120, the bus voltage value VD is acquired based on the voltage detection signal from the voltage detection circuit 42. In S125, it is determined whether the bus voltage value VD acquired in S120 is greater than the maximum value VDmax, which is temporarily stored in the memory. If the bus voltage value VD is smaller than or equal to the maximum value VDmax, the processing proceeds to S135. If the bus voltage value VD is greater than the maximum value VDmax, the processing proceeds to S130.

In S130, the maximum value VDmax is updated from that currently stored in the memory to the bus voltage value VD acquired this time. Each time the bus voltage value VD greater than the currently stored one is acquired, the maximum value VDmax stored in the memory is updated to the acquired bus voltage value VD by the process of S130.

In S135, it is determined whether the bus voltage value VD acquired in S120 is smaller than the minimum value VDmin, which is temporarily stored in the memory. If the bus voltage value VD is greater than or equal to the minimum value VDmin, the processing proceeds to S145. If the bus voltage value VD is smaller than the minimum value VDmin, the processing proceeds to S140.

In S140, the minimum value VDmin is updated from that currently stored in the memory to the bus voltage value VD acquired this time. Each time the bus voltage value VD smaller than the currently stored one is acquired, the minimum value VDmin stored in the memory is updated to the acquired bus voltage value VD by the process of S140.

In S145, it is determined whether the zero-cross has been detected based on the zero-cross detection signal from the zero-cross detection circuit 46. If the zero-cross has not been detected, the processing proceeds to S150. In S150, the current measurement value of the non-detection time Tz is acquired.

In S155, it is determined whether the non-detection time Tz acquired in S150 is longer than or equal to a prescribed time Tth. The prescribed time Tth may be any value that is longer than a half cycle of the AC power.

If the non-detection time Tz is shorter than the prescribed time Tth, the processing returns to S120. If the non-detection time Tz is longer than or equal to the prescribed time Tth, the pre-charging is disabled in S160, the main-charging is disabled in S165, the indicator 32 is turned OFF in S170, and a later-described zero-cross detection count Kz is cleared to zero in S175. Then, the processing returns to S120. The zero-cross detection count Kz is stored in the memory, and is counted up in the process of S180, which will be described below.

In S145, if the zero-cross is detected, the processing proceeds to S180. In S180, the zero-cross detection count Kz stored in the memory is updated to the value obtained by adding 1 to the currently stored value. In S185, the non-detection time Tz being measured currently is cleared to zero, and the time measurement is resumed.

In S190, it is determined whether the zero-cross detection count Kz stored in the memory is greater than or equal to the prescribed number of times Kth. The prescribed number of times Kth may be decided as appropriate, and may be decided within the range of, for example, around five times.

If the zero-cross detection count Kz is smaller than the prescribed number of times Kth, the pre-charging is disabled in S195, the main-charging is disabled in S200, and the indicator 32 is turned OFF in S205. Then, the processing proceeds to S235. If the zero-cross detection count Kz is greater than or equal to the prescribed number of times Kth, the pre-charging is enabled in S210. In this way, the pre-charging of the smoothing capacitor 31 using the resistive element 58 and the second switching element 57 is started.

In S215, the indicator 32 is turned ON. ON of the indicator 32 mentioned here refers to causing the LED in the indicator 32 to illuminate green. Such illumination of the indicator 32 in green makes it possible to indicate to the user that the electric working machine 1 is active and can be operated.

After the indicator 32 is turned ON in S215, the indicator 32 is turned OFF in S170 if, for example, the power plug is pulled out from the socket and the zero-cross is not detected for the prescribed time Tth or longer. That is, when the power plug is pulled out, the indicator 32 is turned OFF if the non-detection time Tz is longer than or equal to the prescribed time Tth, even in a case where the control circuit 38 can still be normally operated by the charging power of the smoothing capacitor 31.

In S220, the difference Vpp, which is a difference between the maximum value VDmax and the minimum value VDmin currently stored in the memory, is calculated. In S225, it is determined whether the difference Vpp calculated in S220 is smaller than or equal to the difference threshold value Vth. The difference threshold value Vth may be decided as appropriate, and is, for example, 20 V in the present embodiment.

If the difference Vpp is greater than the difference threshold value Vth, the processing proceeds to S235. If the difference Vpp is smaller than or equal to the difference threshold value Vth, the main-charging is enabled in S230. In this way, the main-charging of the smoothing capacitor 31 using the first switching element 56 is started. In S235, the maximum value VDmax and the minimum value VDmin currently stored in the memory are both cleared, and the processing returns to S120.

A specific method for clearing the maximum value VDmax in S235 can be conceived in various forms. In S235, for example, the maximum value VDmax may be set to zero. Alternatively, the maximum value VDmax may be deleted from the memory, resulting in a state in which the maximum value VDmax is not stored. In the case where the maximum value VDmax is to be deleted from the memory, it would be sufficient to make an affirmative determination in the first S125 after such deletion and to perform the process of S130.

As for clearance of the minimum value VDmin, a specific method therefor can also be conceived in various forms. In S235, for example, the minimum value VDmin may be deleted from the memory, resulting in a state in which the minimum value VDmin is not stored. Alternatively, the minimum value VDmin may be set to a specified initial value that is greater than a rated maximum value of the AC voltage inputted from the AC power supply 100.

Figure 5A:
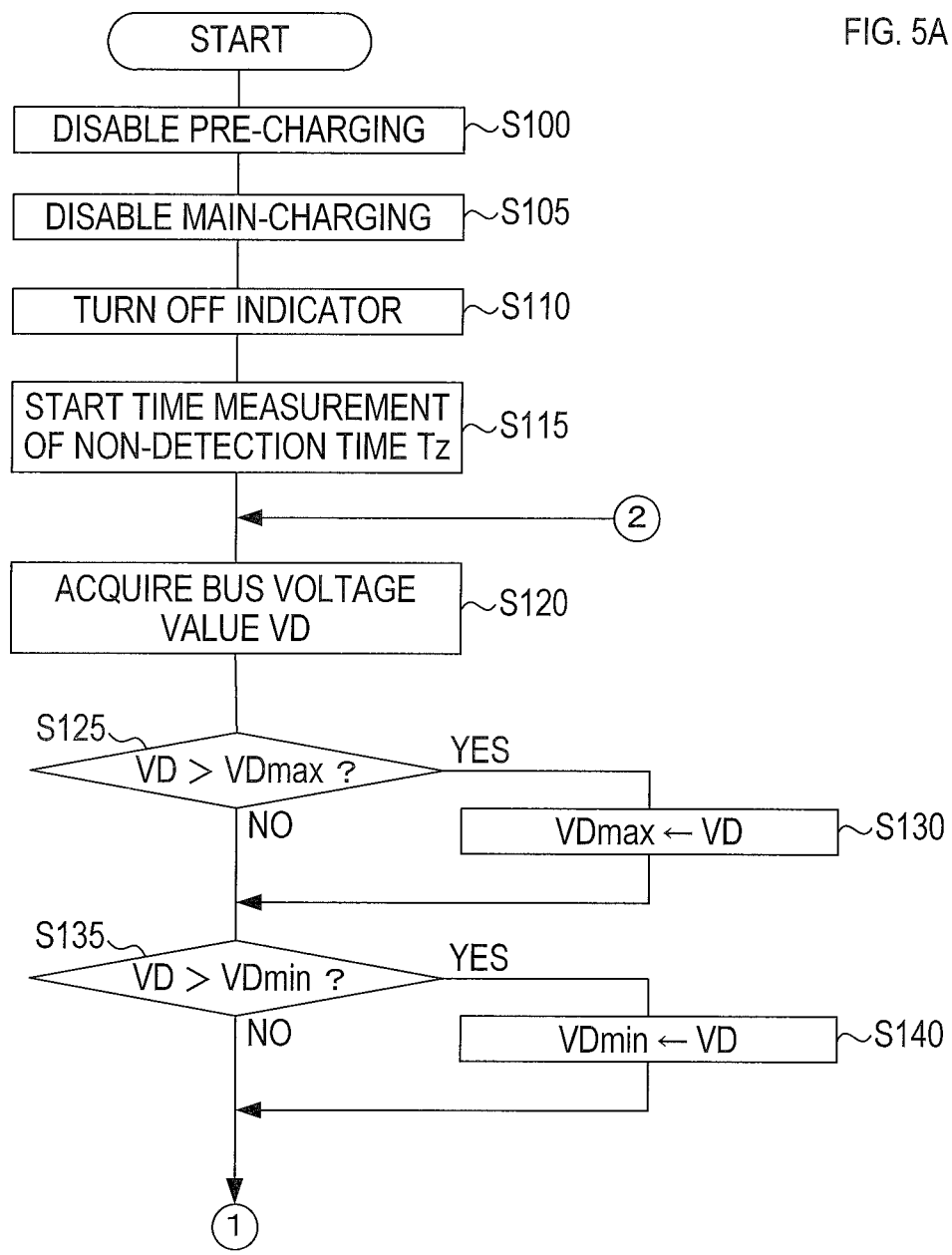
FIG. 5A is a flowchart showing part of an inrush current suppression processing of the first embodiment.
Figure 5B:
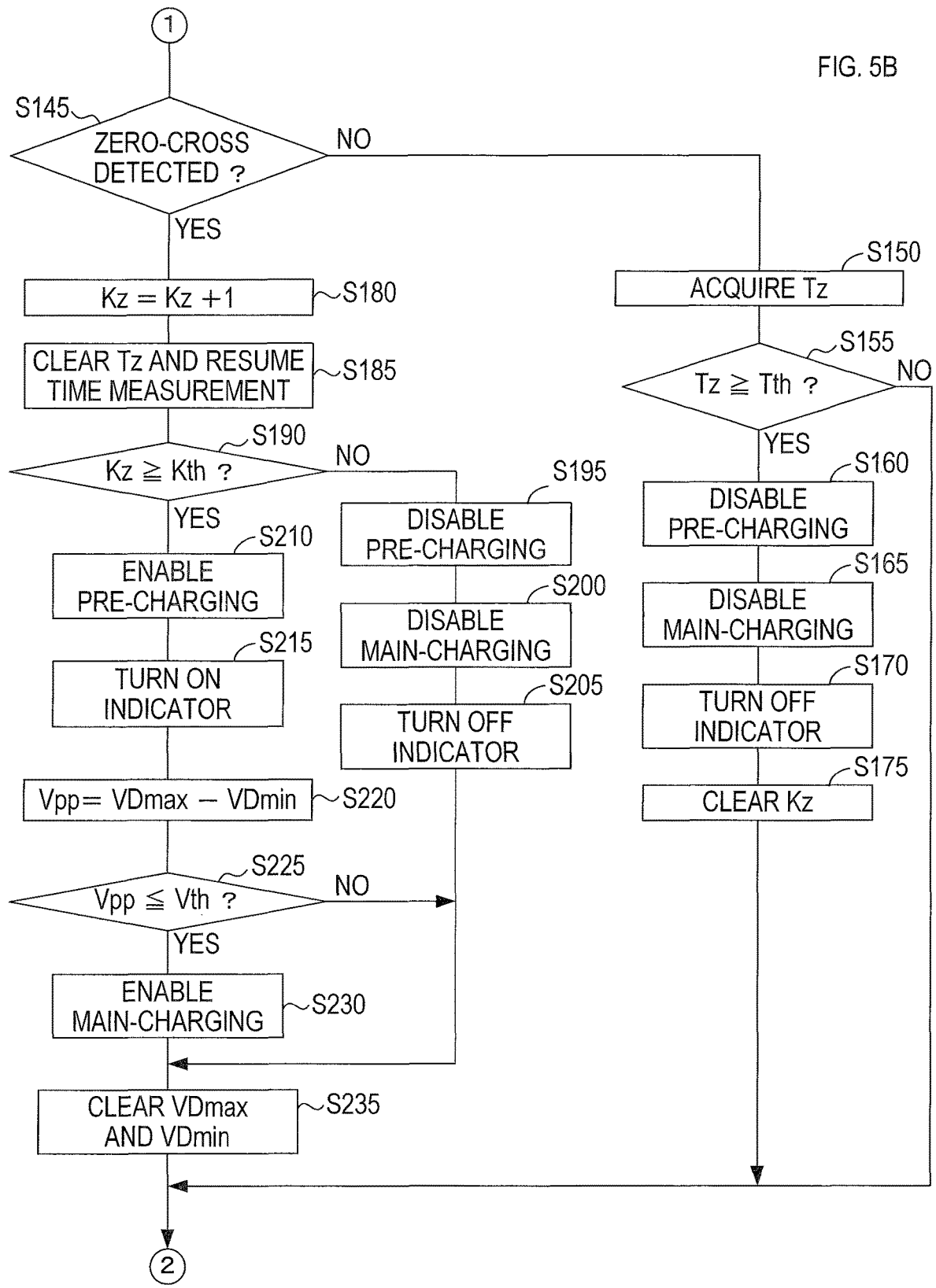
FIG. 5B is a flowchart showing the rest of the inrush current suppression processing of the first embodiment.

In the inrush current suppression processing shown in FIGS. 5A and 5B, each time the zero-cross is detected, the timing of enabling the main-charging is determined based on the difference between the minimum value and the maximum value of the bus voltage value VD in one zero-cross cycle, that is, from the last detection of the zero-cross until the this-time detection of the zero-cross.

The maximum value VDmax, which is stored in the memory, at the time when the zero-cross is detected indicates the maximum value of the bus voltage value VD in the last zero-cross cycle, that is, the peak voltage value in the last zero-cross cycle. This peak voltage value is the maximum value of the absolute value of the AC voltage. In other words, this peak voltage value is the maximum value of the full-wave rectified voltage outputted from the rectifier circuit 35. The processes of S125 to S130 are processes for acquiring the peak voltage value.

The minimum value VDmin, which is stored in the memory, at the time when the zero-cross is detected is approximately equal to the minimum value of the bus voltage value VD in the last zero-cross cycle, that is, the capacitor voltage value, which is the value of the current charging voltage across the smoothing capacitor 31. That is, the processes of S135 to S140 are processes for acquiring the capacitor voltage value.

Thus, each time the zero-cross is detected, the maximum value VDmax stored in the memory can be treated as the peak voltage value, and the minimum value VDmin stored in the memory can be treated as the capacitor voltage value. Accordingly, the difference Vpp calculated in S220 is the value indicating the difference between the peak voltage value and the capacitor voltage value, and the process of S225 is a process for determining whether the difference between the peak voltage value and the capacitor voltage value is smaller than or equal to the difference threshold value Vth.

(1-5) Effects of First Embodiment

The first embodiment described so far provides the following effects (1a) to (1f).

(1a) The timing of turning ON the first switching element 56 in the inrush current suppression circuit 48 is determined based on the peak voltage value. Specifically, the first switching element 56 is turned ON when the difference between the peak voltage value and the capacitor voltage value becomes smaller than or equal to the difference threshold value.

Accordingly, the first switching element 56 can be turned ON at an appropriate timing when the difference between the peak voltage value and the capacitor voltage value has become small. As a result, it can be inhibited that inrush current flows through the smoothing capacitor 31 when the first switching element 56 is turned ON.

(1b) The peak voltage value and the capacitor voltage value are both detected by the control circuit 38 on the basis of the bus voltage value VD detected by the voltage detection circuit 42. In other words, the control circuit 38 detects the peak voltage value and the capacitor voltage value on the basis of the single common voltage detection signal from the voltage detection circuit 42. Accordingly, the control circuit 38 can detect the peak voltage value and the capacitor voltage value with a simple configuration.

(1c) While the first switching element 56 is coupled in series with the smoothing capacitor 31, the series connection circuit comprising the resistive element 58 and the second switching element 57 is coupled in parallel with the first switching element 56. When the AC power is inputted, the second switching element 57 is first turned ON to perform the pre-charging, and subsequently, when the enabling condition is satisfied, the first switching element 56 is turned ON to perform the main-charging. Accordingly, after input of the AC power, charging of the smoothing capacitor 31 can be performed properly while suppressing inrush current.

(1d) The pre-charging and the main-charging are both started immediately after detection of the zero-cross. "Immediately after detection of the zero-cross" is "immediately after the full-wave rectified voltage value outputted from the rectifier circuit 35 has become zero", which means that the full-wave rectified voltage value is very low. Accordingly, by setting the timing of starting the pre-charging to "immediately after detection of the zero-cross", it can be effectively inhibited that inrush current flows through the smoothing capacitor 31 at start of the pre-charging.

Further, by also setting the timing of starting the main-charging after satisfaction of the enabling condition to "immediately after detection of the zero-cross", it can be effectively inhibited that inrush current flows through the smoothing capacitor 31 at start of the main-charging.

The timing of starting the pre-charging and the timing of starting the main-charging may be within a specified period of time that is after detection of the zero-cross. The specified period of time may be, for example, a period of time from detection of the zero-cross until a specified timing that is before the value of the zero-cross detection target AC voltage or the value of the zero-cross detection target AC current first reaches the peak value.

Alternatively, the timing of starting the main-charging may be set as appropriate within a period of time in which the full-wave rectified voltage value from the rectifier circuit 35 is smaller than or equal to the capacitor voltage value. By turning the first switching element 56 ON in the state in which the full-wave rectified voltage value is smaller than or equal to the capacitor voltage value, it can be more effectively inhibited that inrush current flows through the smoothing capacitor 31 when the first switching element 56 is turned ON.

(1e) The pre-charging is performed not immediately after input of the AC power but in the case where the zero-cross is detected the prescribed number of times or more after start of input of the AC power. Accordingly, it can be inhibited that sparks are given off from a connection between the AC power supply 100 and the power plug when the power plug is inserted.

(1f) In the case where the zero-cross is not detected continuously for the prescribed time or longer after input of the AC power, the first switching element 56 and the second switching element 57 are both turned OFF, to thereby interrupt the charging path to the smoothing capacitor 31. Thus, in the case where the power plug is pulled out after start of the pre-charging or after start of the main-charging, no zero-cross is detected any longer and the respective switching elements 56 and 57 are thereby turned OFF. Accordingly, when the power plug is pulled out and inserted into the socket later again, the power plug can be inserted in the state in which the respective switching elements 56 and 57 are both OFF. As a result, it can be inhibited that inrush current flows through the smoothing capacitor 31 when the power plug is inserted.

The inverter 50 corresponds to one example of a drive circuit of the present disclosure. The voltage detection circuit 42 and the control circuit 38 correspond to one example of a peak voltage value acquirer and a capacitor voltage value acquirer of the present disclosure. The zero-cross detection circuit 46 corresponds to one example of a zero-cross detector of the present disclosure. The voltage detection circuit 42 corresponds to one example of a voltage detector of the present disclosure. The first switching element 56 corresponds to one example of a series switching element of the present disclosure. The second switching element 57 corresponds to one example of a parallel switching element of the present disclosure. The enabling condition corresponds to one example of a conducting condition of the present disclosure.

2. Second Embodiment

(2-1) Differences from First Embodiment

A second embodiment is basically configured similarly to the first embodiment, and thus, an explanation will be given below of differences therebetween. In the above-described first embodiment, the inrush current suppression circuit 48 comprises the first switching element 56 and the second switching element 57. On the other hand, in the second embodiment, the inrush current suppression circuit does not comprise the second switching element 57. This is a difference from the first embodiment.

Figure 6:
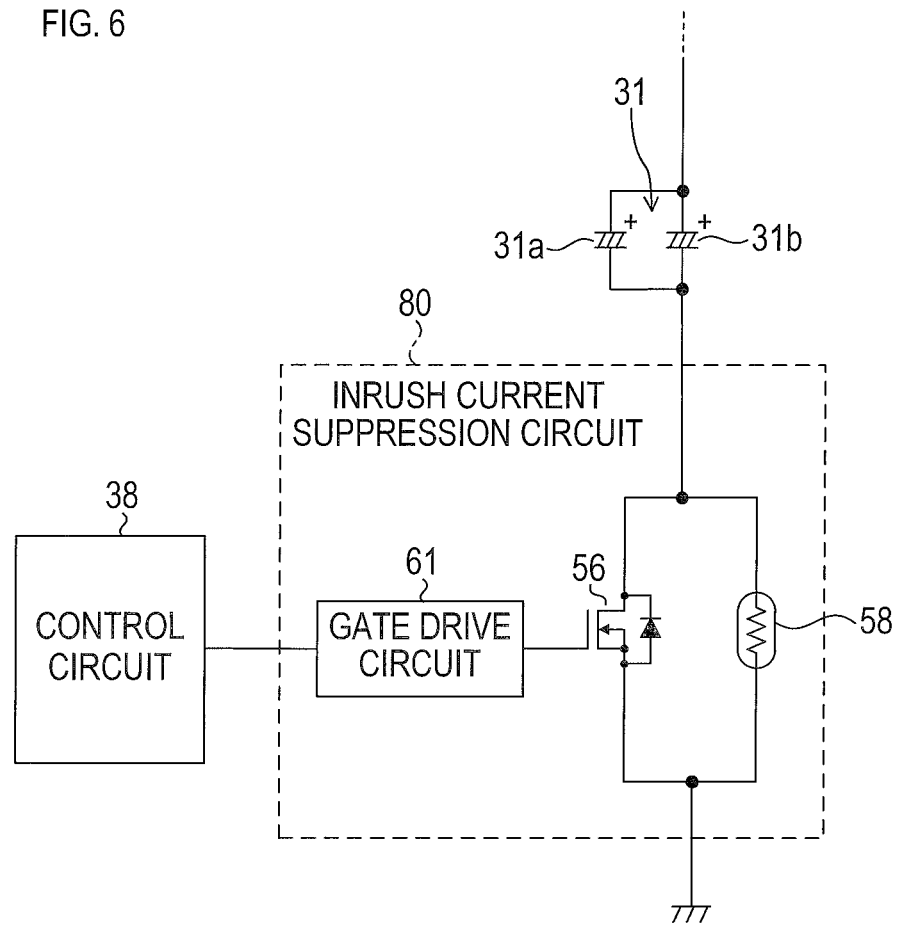
FIG. 6 is an electric circuit diagram of an inrush current suppression circuit of a second embodiment.

Specifically, as shown in FIG. 6, an inrush current suppression circuit 80 of the second embodiment comprises the first switching element 56 and the resistive element 58. The resistive element 58 is coupled in parallel with the first switching element 56.

Thus, when the power plug is inserted into the socket of the AC power supply 100 to start input of the AC power, a charging current flows through the smoothing capacitor 31 and the resistive element 58 to thereby charge the smoothing capacitor 31. Such charging of the smoothing capacitor 31 with the charging current flowing through the resistive element 58 is substantially the same as the pre-charging in the first embodiment, and thus, is referred to as the pre-charging in the second embodiment, too. In other words, in the second embodiment, upon input of the AC power from the power plug, the pre-charging starts promptly.

In the second embodiment, since the inrush current suppression circuit 80 does not comprise the second switching element 57, an inrush current suppression processing performed by the control circuit 38 also differs somewhat from the inrush current suppression processing of the first embodiment shown in FIGS. 5A and 5B.

(2-2) Inrush Current Suppression Processing

Figure 7:
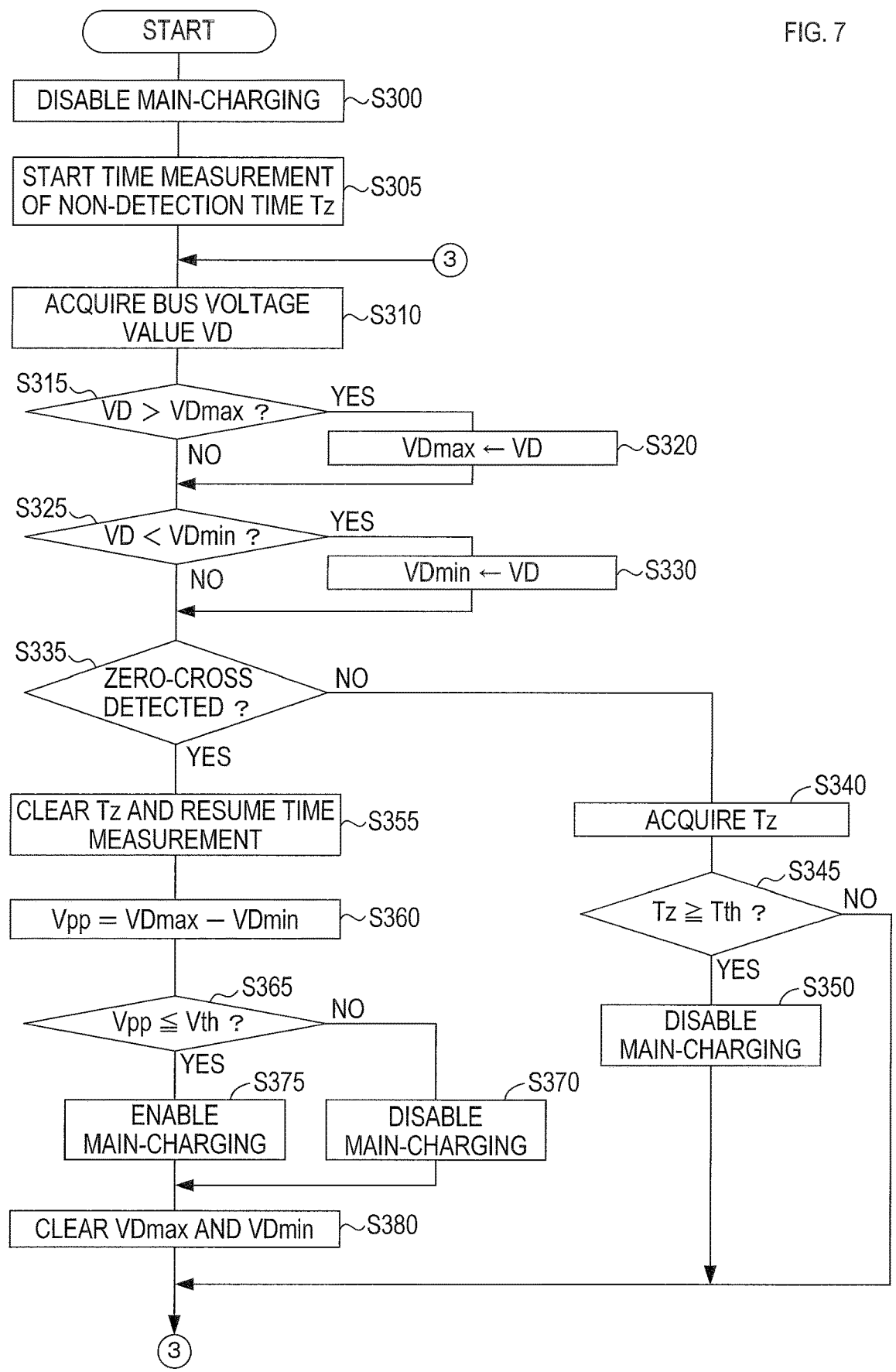
FIG. 7 is a flowchart showing an inrush current suppression processing of the second embodiment.

The inrush current suppression processing of the second embodiment will be described with reference to a flowchart shown in FIG. 7. Upon start of the inrush current suppression processing in FIG. 7, the control circuit 38 disables the main-charging in S300 similarly to S100 in FIG. 5A. In the second embodiment, the pre-charging is already started at the point of start of the inrush current suppression processing in FIG. 7.

In S305, time measurement of the non-detection time Tz is started. Processes of S310 to S330 are the same as the processes of S120 to S140 in FIG. 5A. That is, in S310 to S330, the bus voltage value VD is acquired, and the maximum value VDmax and the minimum value VDmin stored in the memory are updated according to magnitude relationships between the acquired bus voltage value VD and each of the maximum value VDmax and the minimum value VDmin stored in the memory.

In S335, it is determined whether the zero-cross has been detected based on the zero-cross detection signal from the zero-cross detection circuit 46. If the zero-cross has not been detected, the processing proceeds to S340. In S340, the current measurement value of the non-detection time Tz is acquired.

In S345, it is determined whether the non-detection time Tz acquired in S340 is longer than or equal to the prescribed time Tth. If the non-detection time Tz is shorter than the prescribed time Tth, the processing returns to S310. If the non-detection time Tz is longer than or equal to the prescribed time Tth, the main-charging is disabled in S350, and the processing returns to S310.

If the zero-cross has been detected in S335, the processing proceeds to S355. In S355, the non-detection time Tz being measured currently is cleared to zero, and the time measurement is resumed. In S360, the difference Vpp, which is a difference between the maximum value VDmax (i.e., the peak voltage value) and the minimum value VDmin (i.e., the capacitor voltage value) currently stored in the memory, is calculated.

In S365, it is determined whether the difference Vpp calculated in S360 is smaller than or equal to the difference threshold value Vth. If the difference Vpp is larger than the difference threshold value Vth, the main-charging is disabled in S370, and the processing proceeds to S380. If the difference Vpp is smaller than or equal to the difference threshold value Vth, the main-charging is enabled in S375. In this way, the main-charging of the smoothing capacitor 31 using the first switching element 56 is started. In S380, the maximum value VDmax and the minimum value VDmin currently stored in the memory are both cleared similarly to S235 in FIG. 5B, and the processing returns to S310.

(2-3) Effects of Second Embodiment

The second embodiment detailed so far provides effects equivalent to those of the above-described first embodiment in terms of the main-charging.

3. Third Embodiment (3-1) Differences from First Embodiment

A third embodiment is basically configured similarly to the first embodiment, and thus, an explanation will be given below of differences therebetween. The third embodiment differs from the first embodiment in the details of the inrush current suppression processing performed by the control circuit 38, especially, in the enabling condition for starting the main-charging.

Specifically, in the first embodiment, the enabling condition for the main-charging is that the difference Vpp, which is the difference between the peak voltage value and the capacitor voltage value, is smaller than or equal to the difference threshold value Vth. On the other hand, the enabling condition for the main-charging of the third embodiment is that a set time TS elapses after start of the pre-charging. The set time TS is determined based on the peak voltage value. Specifically, the larger the peak voltage value is, the longer the set time TS is.

(3-2) Inrush Current Suppression Processing

Figure 8A:
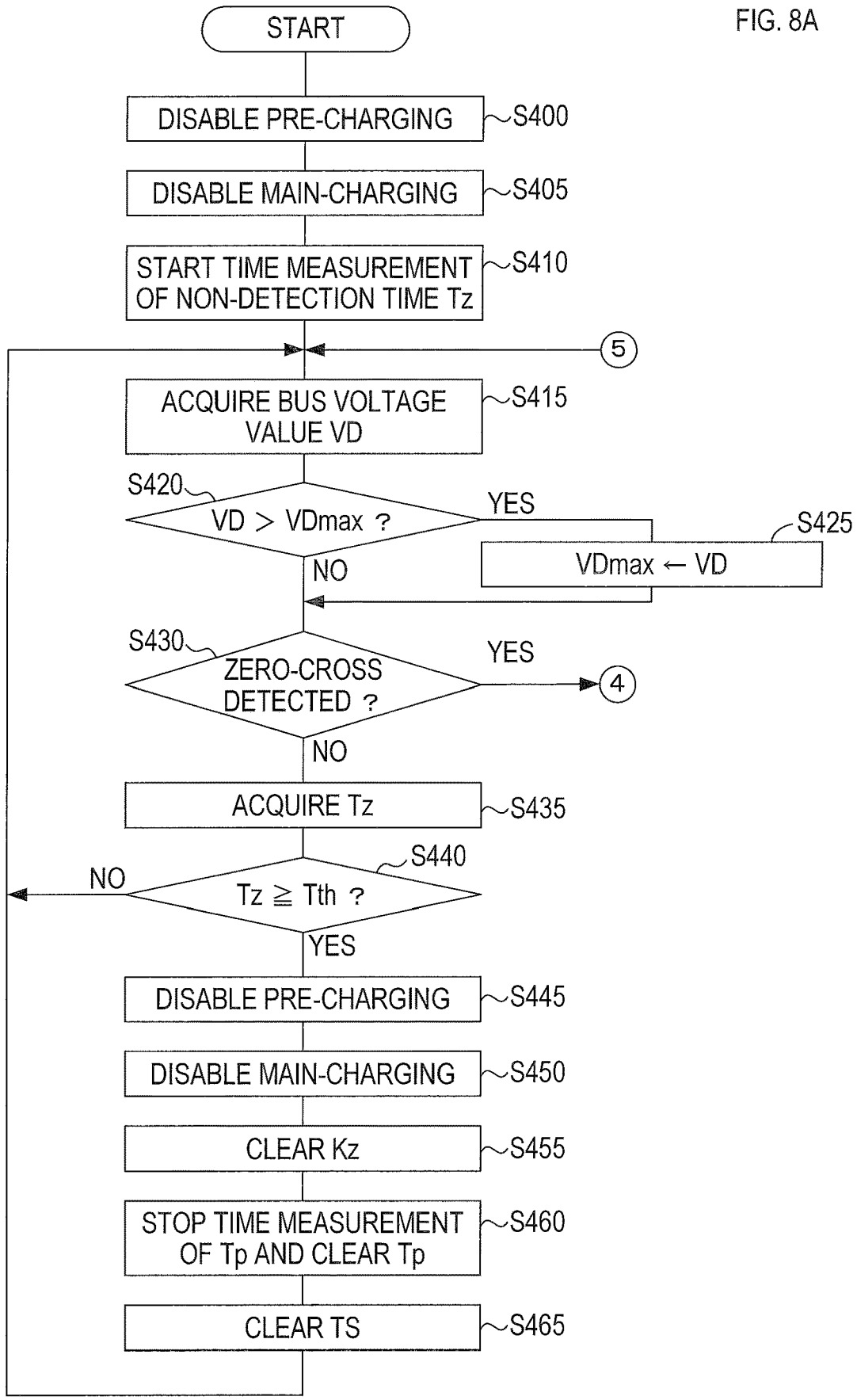
FIG. 8A is a flowchart showing part of an inrush current suppression processing of a third embodiment.

The inrush current suppression processing of the third embodiment will be described with reference to a flowchart shown in FIGS. 8A and 8B. In the inrush current suppression processing of the present third embodiment, processes of S400 to S425 are the same as the processes of S100 to S130 in the inrush current suppression processing of the first embodiment shown in FIG. 5A. That is, in the third embodiment, the peak voltage value is detected similarly to the first embodiment, although detection of the capacitor voltage value performed in the first embodiment is not performed.

Upon proceeding to S430, the control circuit 38 of the third embodiment determines whether the zero-cross has been detected based on the zero-cross detection signal from the zero-cross detection circuit 46. If the zero-cross has not been detected, the processing proceeds to S435. In S435, the current measurement value of the non-detection time Tz is acquired. In S440, it is determined whether the non-detection time Tz acquired in S435 is longer than or equal to the prescribed time Tth.

If the non-detection time Tz is shorter than the prescribed time Tth, the processing returns to S415. If the non-detection time Tz is longer than or equal to the prescribed time Tth, the pre-charging is disabled in S445, the main-charging is disabled in S450, and the zero-cross detection count Kz is cleared to zero in S455. Further, later-described time measurement of a pre-charging elapsed time Tp is stopped and the measurement value is cleared to zero in S460, and the set time TS stored in the memory is cleared in S465. Then, the processing returns to S415. The time measurement of the pre-charging elapsed time Tp is started in S515 upon start of the pre-charging.

Figure 8B:
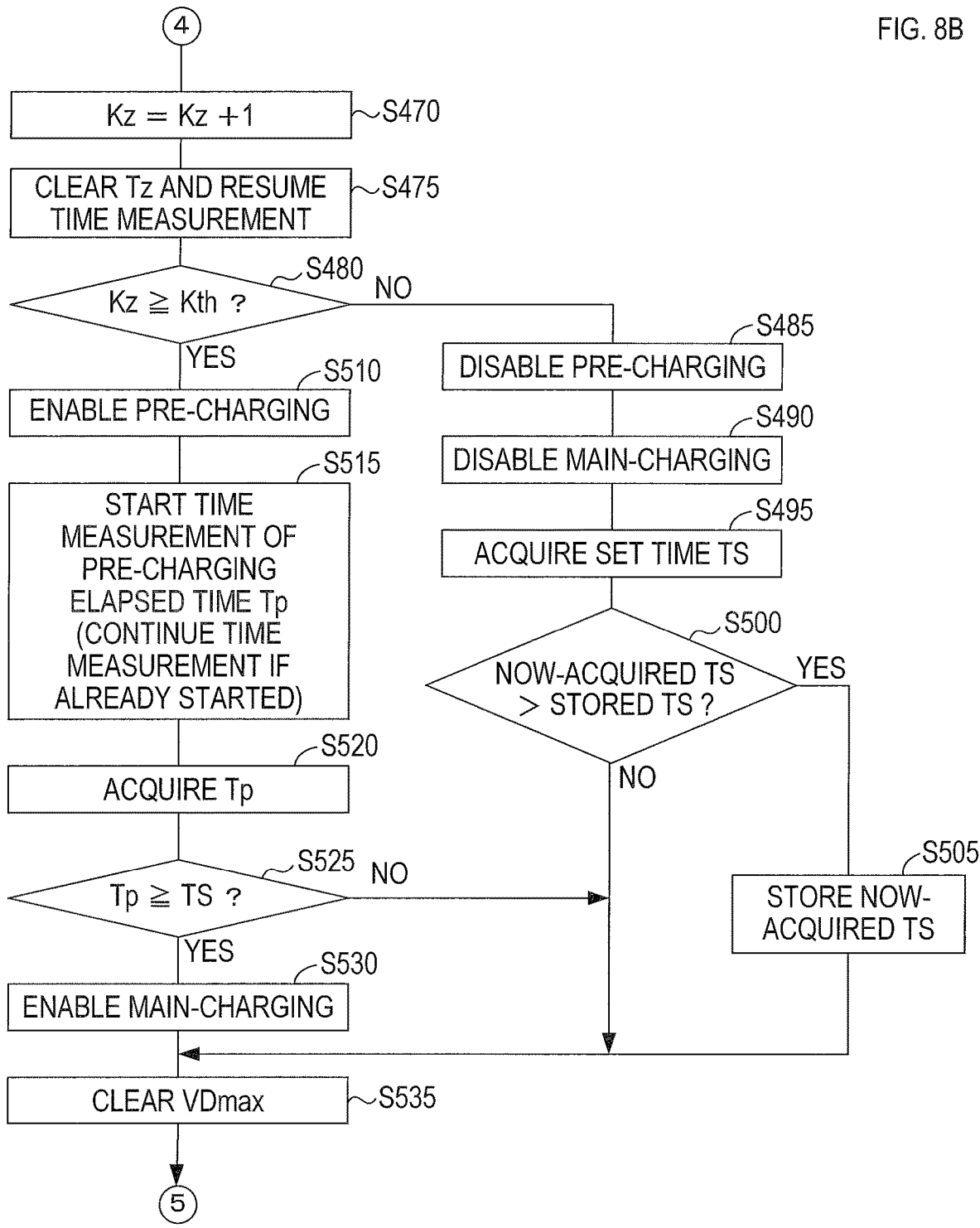
FIG. 8B is a flowchart showing the rest of the inrush current suppression processing of the third embodiment.

If the zero-cross has been detected in S430, the processing proceeds to S470 in FIG. 8B. In S470, the zero-cross detection count Kz stored in the memory is updated to a value obtained by adding 1 to the current value. In S475, the non-detection time Tz being measured currently is cleared to zero, and the time measurement is resumed.

In S480, it is determined whether the zero-cross detection count Kz stored in the memory is greater than or equal to the prescribed number of times Kth. If the zero-cross detection count Kz is smaller than the prescribed number of times Kth, the pre-charging is disabled in S485, and the main-charging is disabled in S490. Then, the set time TS is acquired in S495.

The set time TS is set based on the maximum value VDmax currently stored in the memory, that is, based on the peak voltage value. Specifically, a set time table shown in FIG. 9, which is stored in advance in the memory, is referred to, and the set time TS corresponding to the currently stored maximum value VDmax is acquired. For example, if the currently stored maximum value VDmax is 115 V, 260 [ms] is acquired as the set time TS.

In the set time table, the set time TS is set in a stepwise manner such that the larger the maximum value VDmax is, the longer the set time TS is. The set time table shown in FIG. 9 is just one example, and thus, the correspondence relationship between the maximum value VDmax and the set time TS may be decided as appropriate.

After the set time TS is acquired in S495, it is determined in S500 whether the set time TS acquired this time is longer than the set time TS already stored in the memory as a pre-charging performance time. If the acquired set time TS is shorter than or equal to the set time TS stored in the memory as the pre-charging performance time, the processing proceeds to S535. If the acquired set time TS is longer than the set time TS stored in the memory as the pre-charging performance time, the set time TS is updated in S505 from that currently stored in the memory as the pre-charging performance time to the set time TS acquired this time, and the processing proceeds to S535. In S535, the maximum value VDmax currently stored in the memory is cleared, and the processing returns to S415.

In S480, if the zero-cross detection count Kz is greater than or equal to the prescribed number of times Kth, the pre-charging is enabled in S510. In S515, the time measurement of the pre-charging elapsed time Tp is started. In the case where the time measurement of the pre-charging elapsed time Tp has already been started, such time measurement is continued.

In S520, the measurement value of the pre-charging elapsed time Tp being measured currently is acquired. In S525, it is determined whether the pre-charging elapsed time Tp acquired in S520 is longer than or equal to the set time TS stored in the memory as the pre-charging performance time. If the pre-charging elapsed time Tp has not reached the set time TS yet, the processing proceeds to S535. If the pre-charging elapsed time Tp is longer than or equal to the set time TS, the main-charging is enabled in S530, and the processing proceeds to S535.

(3-3) Effects of Third Embodiment

The third embodiment detailed so far provides effects equivalent to those of the above-described first embodiment in terms of the pre-charging.

In the third embodiment, the enabling condition for the main-charging is that the elapsed time from start of the pre-charging is longer than or equal to the set time TS. The set time TS is determined based on the peak voltage value, with reference to the set time table.

Accordingly, by properly setting in advance the set time TS corresponding to the peak voltage value, the main-charging can be started in the state in which the difference between the peak voltage value and the capacitor voltage value has become moderately small after start of the pre-charging.

In the set time table, the larger the peak voltage value is, the longer the set time TS is. This is because it is conceivable that the larger the peak voltage value is, the longer the time required to bring the capacitor voltage value of the smoothing capacitor 31 closer to the peak voltage value is. Accordingly, by setting the set time TS to be longer as the peak voltage value is larger, the main-charging can be enabled in the state in which the difference between the peak voltage value and the capacitor voltage value has become small.

(3-4) Modified Example of Third Embodiment

The enabling condition for the main-charging in the third embodiment is also applicable to the configuration of the inrush current suppression circuit described in the second embodiment, that is, to the configuration not comprising the second switching element 57.

For example, upon start-up, the control circuit 38 starts time measurement of an elapsed time from the start-up. At this point of time, the pre-charging has already been started. Then, the processes of S495 to S505 in FIG. 8B are performed before the zero-cross is detected the prescribed number of times Kth or more, to thereby acquire the set time TS on the basis of the peak voltage value, and the acquired set time TS is stored in the memory as the pre-charging performance time.

Then, after the elapsed time from the start-up has become longer than or equal to the prescribed time Tth, each time the zero-cross is detected, it is determined whether the elapsed time from the start-up at the time has become longer than or equal to the set time TS stored in the memory as the pre-charging performance time. Then, when the elapsed time from the start-up has become longer than or equal to the set time TS, the main-charging is enabled.

4. Other Embodiments

Although the embodiments of the present disclosure have been described so far, the present disclosure is not limited to the above-described embodiments, and can be implemented with various modifications.

(4-1) In the first embodiment and the third embodiment, the pre-charging is enabled after the zero-cross is detected the prescribed number of times Kth or more after start-up of the control circuit 38 by way of example. However, the pre-charging may be started by turning the second switching element 57 ON regardless of whether the zero-cross is detected after the start-up.

(4-2) The method for acquiring the peak voltage value is not limited to that based on the voltage detection signal from the voltage detection circuit 42. For example, a method may be adopted in which the value of the AC voltage before rectification by the rectifier circuit 35 is acquired and the maximum value of the acquired value of the AC voltage in one zero-cross cycle is acquired as the peak voltage value. The method for acquiring the capacitor voltage value is also not limited to that based on the voltage detection signal from the voltage detection circuit 42, but other methods may be adopted.

(4-3) In the third embodiment, adopted as the pre-charging performance time is the set time TS corresponding to the maximum peak voltage value among the peak voltage values each generated in the corresponding zero-cross cycle before the zero-cross detection count Kz reaches the prescribed number of times Kth. Instead, for example, when the zero-cross detection count Kz has reached the prescribed number of times Kth, the set time TS corresponding to the peak voltage value stored in the memory at the time may be acquired from the set time table, and the acquired set time TS may be adopted as the pre-charging performance time.

(4-4) The zero-cross may be detected by a detection method other than the above-described detection method based on the AC power inputted to the rectifier circuit 35. For example, the zero-cross may be detected based on the voltage value or the current value of the rectified power outputted from the rectifier circuit 35.

(4-5) The rectifier circuit 35 comprising the diode bridge shown in FIG. 2 is just one example of the rectifier circuit. The rectifier circuit may comprise a circuit other than the diode bridge.

To use the IPM as the drive circuit is just one example. For example, each of the switching elements Q1 to Q6 in the inverter 50 may be a separate discrete component, and may be mounted individually on the circuit board.

The switching elements 56 and 57 in the inrush current suppression circuit 48 may be switching elements other than the FET. When using a switching element allowing the current to flow only in one direction, such as a bipolar transistor or an IGBT, a diode may be coupled in parallel with the switching element in order to enable discharge from the smoothing capacitor 31.

(4-6) The motor 15 may be a motor other than the brushless motor. The motor 15 may be, for example, a brushed DC motor. When adopting the motor other than the brushless motor, a drive circuit that can drive the motor properly may be used.

(4-7) In the above-described embodiments, illustrated as the overcurrent protection function of the IPM 37 is a configuration in which the protection circuit 52 detects overcurrent on the basis of the current detection signal inputted from the current detection circuit 43. However, in place of or in addition to this configuration, the IPM 37 may comprise a function of detecting the load current value not on the basis of the current detection signal from the current detection circuit 43, and may comprise a configuration to detect overcurrent on the basis of the load current value detected by the function.

(4-8) In the above-described embodiments, the circular saw is illustrated as one example of the electric working machine. However, the present disclosure is applicable to various electric working machines configured such that the AC power supplied from the AC power supply is rectified and smoothed, and the rectified and smoothed AC power is supplied to the drive circuit for driving the motor. More specifically, the present disclosure is applicable to electric working machines such as an electric hammer, an electric hammer drill, an electric drill, an electric driver, an electric wrench, an electric grinder, an electric reciprocating saw, an electric jigsaw, an electric cutter, an electric chainsaw, an electric plane, an electric nailer (including an electric tacker), an electric hedge trimmer, an electric lawn mower, an electric lawn trimmer, an electric grass cutter, an electric cleaner, and an electric blower.

(4-9) The functions of one element in the above-described embodiments may be performed by two or more elements. One function of one element may be performed by two or more elements. The functions performed by two or more elements may be performed by one element. One function performed by two or more elements may be performed by one element. Part of the configuration of the above-described embodiments may be omitted. At least part of the configuration of one of the above-described embodiments may be added to or replaced with other configuration of another one of the above-described embodiments.

What is claimed is:

1. An electric working machine comprising:
   a motor;
   a rectifier circuit configured to rectify an AC power inputted from an AC power supply and to output a rectified power, the AC power fluctuating periodically;
   a capacitor including a first electrode and a second electrode, the first electrode being electrically coupled with the rectifier circuit, the capacitor being configured to be charged by the rectified power outputted from the rectifier circuit and to smooth the rectified power;
   a first switching element, which is a switching element electrically coupled with the second electrode;
   a resistive element including a first terminal electrically coupled with the second electrode;
   a drive circuit configured to drive the motor based on a power smoothed by the capacitor;
   a peak voltage value acquirer configured to acquire a peak voltage value, which is a maximum absolute value of a voltage of the AC power; and
   a controller configured to bring the first switching element into conduction in a case where the AC power is inputted to the rectifier circuit and where a specified conducting condition based on the peak voltage value acquired by the peak voltage value acquirer is satisfied,
   wherein the first switching element and/or the resistive element are/is arranged so as to allow a charging current to flow from the rectifier circuit to the capacitor and a discharging current to flow from the capacitor to the drive circuit,
   wherein the resistive element includes a second terminal,
   wherein the electric working machine further comprises a second switching element, which is a switching element electrically coupled with the second terminal, and
   wherein the controller is configured to bring the second switching element into conduction when the AC power is inputted to the rectifier circuit, and to subsequently bring the first switching element into conduction when the conducting condition is satisfied.

2. The electric working machine according to claim 1, further comprising a zero-cross detector configured to detect a zero-cross of a detection target, the detection target being a voltage or a current of the AC power,
   wherein the controller is configured to bring the second switching element into conduction within a specified period of time that is after the zero-cross is detected by the zero-cross detector, and
   wherein the specified period of time is a period of time from detection of the zero-cross until a specified timing that is before a value of the detection target first reaches a peak value.

3. The electric working machine according to claim 1, further comprising a zero-cross detector configured to detect a zero-cross of a voltage or a current of the AC power,
   wherein the controller is configured to bring the second switching element into conduction when the zero-cross is detected a prescribed number of times or more by the zero-cross detector after start of input of the AC power to the rectifier circuit.

4. The electric working machine according to claim 1, further comprising a zero-cross detector configured to detect a zero-cross of a voltage or a current of the AC power,
   wherein the controller is configured to bring the second switching element out of conduction when the zero-cross is not detected by the zero-cross detector continuously for a prescribed time or longer.

5. An electric working machine comprising:
   a motor;
   a rectifier circuit configured to rectify an AC power inputted from an AC power supply and to output a rectified power, the AC power fluctuating periodically;
   a capacitor including a first electrode and a second electrode, the first electrode being electrically coupled with the rectifier circuit, the capacitor being configured to be charged by the rectified power outputted from the rectifier circuit and to smooth the rectified power;
   a first switching element, which is a switching element electrically coupled with the second electrode;
   a resistive element including a first terminal electrically coupled with the second electrode;
   a drive circuit configured to drive the motor based on a power smoothed by the capacitor;
   a peak voltage value acquirer configured to acquire a peak voltage value, which is a maximum absolute value of a voltage of the AC power; and
   a controller configured to bring the first switching element into conduction in a case where the AC power is inputted to the rectifier circuit and where a specified conducting condition based on the peak voltage value acquired by the peak voltage value acquirer is satisfied,
   wherein the first switching element and/or the resistive element are/is arranged so as to allow a charging current to flow from the rectifier circuit to the capacitor and a discharging current to flow from the capacitor to the drive circuit,
   wherein the electric working machine further comprises a zero-cross detector configured to detect a zero-cross of a detection target, the detection target being a voltage or a current of the AC power,
   wherein the controller is configured to bring the first switching element into conduction when the conducting condition is satisfied and within a specified period of time that is after the zero-cross is detected by the zero-cross detector, and
   wherein the specified period of time is a period of time from detection of the zero-cross until a specified timing that is before a value of the detection target first reaches a peak value.

6. An electric working machine comprising:
   a motor;
   a rectifier circuit configured to rectify an AC power inputted from an AC power supply and to output a rectified power, the AC power fluctuating periodically;
   a capacitor including a first electrode and a second electrode, the first electrode being electrically coupled with the rectifier circuit, the capacitor being configured to be charged by the rectified power outputted from the rectifier circuit and to smooth the rectified power;

a first switching element, which is a switching element electrically coupled with the second electrode;
a resistive element including a first terminal electrically coupled with the second electrode;
a drive circuit configured to drive the motor based on a power smoothed by the capacitor;
a peak voltage value acquirer configured to acquire a peak voltage value, which is a maximum absolute value of a voltage of the AC power; and
a controller configured to bring the first switching element into conduction in a case where the AC power is inputted to the rectifier circuit and where a specified conducting condition based on the peak voltage value acquired by the peak voltage value acquirer is satisfied,
wherein the first switching element and/or the resistive element are/is arranged so as to allow a charging current to flow from the rectifier circuit to the capacitor and a discharging current to flow from the capacitor to the drive circuit,
wherein the controller is configured to bring the first switching element into conduction in a case where the conducting condition is satisfied and where a voltage value of the rectified power outputted from the rectifier circuit is smaller than or equal to the capacitor voltage value,
wherein the electric working machine further comprises a zero-cross detector configured to detect a zero-cross of a voltage or a current of the AC power, and
wherein the controller is configured to bring the first switching element out of conduction when the zero-cross is not detected by the zero-cross detector continuously for a prescribed time or longer.

7. An electric working machine comprising:
a motor;
a rectifier circuit configured to rectify an AC power inputted from an AC power supply and to output a rectified power, the AC power fluctuating periodically;
a capacitor including a first electrode and a second electrode, the first electrode being electrically coupled with the rectifier circuit, the capacitor being configured to be charged by the rectified power outputted from the rectifier circuit and to smooth the rectified power;
a first switching element, which is a switching element electrically coupled with the second electrode;
a resistive element including a first terminal and a second terminal, the first terminal being electrically coupled with the second electrode;
a second switching element, which is a switching element electrically coupled with the second terminal;
a drive circuit configured to drive the motor based on a power smoothed by the capacitor;
a peak voltage value acquirer configured to acquire a peak voltage value, which is a maximum absolute value of a voltage of the AC power; and
a controller configured to bring the first switching element into conduction in a case where the AC power is inputted to the rectifier circuit and where a specified conducting condition based on the peak voltage value acquired by the peak voltage value acquirer is satisfied,
wherein the controller is configured to bring the second switching element into conduction when the AC power is inputted to the rectifier circuit, and to subsequently bring the first switching element into conduction when the conducting condition is satisfied.

8. An electric working machine comprising:
a motor;
a rectifier circuit configured to rectify an AC power inputted from an AC power supply and to output a rectified power, the AC power fluctuating periodically;
a capacitor including a first electrode and a second electrode, the first electrode being electrically coupled with the rectifier circuit, the capacitor being configured to be charged by the rectified power outputted from the rectifier circuit and to smooth the rectified power;
a first switching element, which is a switching element electrically coupled-with the second electrode;
a resistive element including a first terminal and a second terminal, the first terminal being electrically coupled with the second electrode;
a second switching element, which is a switching element electrically coupled with the second terminal;
a drive circuit configured to drive the motor based on a power smoothed by the capacitor;
a peak voltage value acquirer configured to acquire a peak voltage value, which is a maximum absolute value of a voltage of the AC power; and
a controller configured to bring the first switching element into conduction in a case where the AC power is inputted to the rectifier circuit and where a specified conducting condition based on the peak voltage value acquired by the peak voltage value acquirer is satisfied,
wherein the controller is configured to determine a set time to be used as the conducting condition, based on the peak voltage value acquired by the peak voltage value acquirer,
wherein the conducting condition comprises a condition that the set time elapses from a specified time measurement start timing that is after start of input of the AC power to the rectifier circuit, and
wherein the controller is configured to bring the second switching element into conduction when input of the AC power to the rectifier circuit is started, and to subsequently bring the first switching element into conduction when the conducting condition is satisfied.

9. An electric working machine comprising:
a motor;
a rectifier circuit configured to rectify an AC power inputted from an AC power supply and to output a rectified power, the AC power fluctuating periodically;
a capacitor including a first electrode and a second electrode, the first electrode being electrically coupled with the rectifier circuit, the capacitor being configured to be charged by the rectified power outputted from the rectifier circuit and to smooth the rectified power;
a first switching element, which is a switching element electrically coupled with the second electrode;
a resistive element including a first terminal and a second terminal, the first terminal being electrically coupled with the second electrode;
a drive circuit configured to drive the motor based on a power smoothed by the capacitor;
a peak voltage value acquirer configured to acquire a peak voltage value, which is a maximum absolute value of a voltage of the AC power; and
a controller configured to bring the first switching element into conduction in a case where the AC power is inputted to the rectifier circuit and where a specified conducting condition based on the peak voltage value acquired by the peak voltage value acquirer is satisfied, and configured to determine a set time to be used as the conducting condition, based on the peak voltage value acquired by the peak voltage value acquirer, the conducting condition comprising a condition that the set time elapses from a specified time measurement start timing that is after start of input of the AC power to the rectifier circuit, wherein the first switching element and/or the resistive element are/is arranged so as to allow a charging current to flow from the rectifier circuit to the capacitor and a discharging current to flow from the capacitor to the drive circuit, wherein the electric working machine further comprises a second switching element electrically coupled with the second terminal, and wherein the controller is configured to bring the second switching element into conduction when input of the AC power to the rectifier circuit is started, and to subsequently bring the first switching element into conduction when the conducting condition is satisfied.

10. The electric working machine according to claim 9, wherein the time measurement start timing is a timing at which the second switching element is brought into conduction.

11. An electric working machine comprising:
a motor;
a rectifier circuit configured to rectify an AC power inputted from an AC power supply and to output a rectified power, the AC power fluctuating periodically;
a capacitor including a first electrode and a second electrode, the first electrode being electrically coupled with the rectifier circuit, the capacitor being configured to be charged by the rectified power outputted from the rectifier circuit and to smooth the rectified power;
a first switching element, which is a switching element electrically coupled with the second electrode;
a resistive element including a first terminal and a second terminal, the first terminal being electrically coupled with the second electrode;
a drive circuit configured to drive the motor based on a power smoothed by the capacitor;
a peak voltage value acquirer configured to acquire a peak voltage value, which is a maximum absolute value of a voltage of the AC power; and
a controller configured to bring the first switching element into conduction in a case where the AC power is inputted to the rectifier circuit and where a specified conducting condition based on the peak voltage value acquired by the peak voltage value acquirer is satisfied, and configured to determine a set time to be used as the conducting condition, based on the peak voltage value acquired by the peak voltage value acquirer, the conducting condition comprising a condition that the set time elapses from a specified time measurement start timing that is after start of input of the AC power to the rectifier circuit, wherein the first switching element and/or the resistive element are/is arranged so as to allow a charging current to flow from the rectifier circuit to the capacitor and a discharging current to flow from the capacitor to the drive circuit, and wherein the controller is configured to determine the set time such that the larger the peak voltage value is, the longer the set time is.

* * * * *